(12) United States Patent
Sugita et al.

(10) Patent No.: US 10,903,100 B2
(45) Date of Patent: Jan. 26, 2021

(54) METHOD OF OBTAINING AMOUNT OF DEVIATION OF A MEASURING DEVICE, AND METHOD OF CALIBRATING TRANSFER POSITION DATA IN A PROCESSING SYSTEM

(71) Applicant: TOKYO ELECTRON LIMITED, Tokyo (JP)

(72) Inventors: Kippei Sugita, Miyagi (JP); Daisuke Kawano, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 116 days.

(21) Appl. No.: 16/198,924

(22) Filed: Nov. 23, 2018

(65) Prior Publication Data

US 2019/0164791 A1    May 30, 2019

(30) Foreign Application Priority Data

Nov. 24, 2017 (JP) ................. 2017-225510

(51) Int. Cl.
  *G01R 27/26* (2006.01)
  *H01L 21/67* (2006.01)
  (Continued)

(52) U.S. Cl.
  CPC ..... *H01L 21/67265* (2013.01); *G01D 5/2412* (2013.01); *H01J 37/32642* (2013.01);
  (Continued)

(58) Field of Classification Search
  USPC .......................... 324/658, 660–663, 671, 686
  See application file for complete search history.

(56) References Cited

U.S. PATENT DOCUMENTS

| | | | |
|---|---|---|---|
| 6,502,054 B1 * | 12/2002 | Mooring | ............ G05B 19/4083 702/149 |
| 9,903,739 B2 | 2/2018 | Sugita et al. | |
| 2015/0138687 A1 * | 5/2015 | Boyd, Jr. | .......... H01L 21/67288 361/234 |

FOREIGN PATENT DOCUMENTS

JP    2017-3557 A    1/2017

* cited by examiner

*Primary Examiner* — Vincent Q Nguyen
(74) *Attorney, Agent, or Firm* — Rothwell, Figg, Ernst & Manbeck, P.C.

(57) ABSTRACT

A measuring device includes sensor electrodes provided along a periphery of a base substrate such that a sum A of shortest distances from the sensor electrodes to an inner peripheral surface of a focus ring becomes a constant value, the sum A satisfying $$\sum_{i=1}^{N} \frac{a}{C_i} = A$$

the number of the sensor electrodes, $C_i$: measurement values and "a": constant). A method of obtaining the amount of deviation of the central position of the measuring device in a region surrounded by the focus ring from the center of the region, includes: calculating the measurement values $C_i$ using the measuring device; calculating the constant "a" using the measurement values $C_i$; calculating distances from the sensor electrodes to the inner peripheral surface of the focus ring using the constant "a" and the measurement values $C_i$; and calculating the amount of deviation of the central position of the measuring device based on the calculated distances.

8 Claims, 19 Drawing Sheets

(51) Int. Cl.
*G01D 5/241* (2006.01)
*H01L 21/68* (2006.01)
*H01L 21/683* (2006.01)
*H01L 21/677* (2006.01)
*H01J 37/32* (2006.01)
*H01L 21/687* (2006.01)

(52) U.S. Cl.
CPC .. *H01L 21/67259* (2013.01); *H01L 21/67745* (2013.01); *H01L 21/68* (2013.01); *H01L 21/6831* (2013.01); *H01L 21/6833* (2013.01); *H01L 21/68735* (2013.01)

METHOD OF OBTAINING AMOUNT OF DEVIATION OF A MEASURING DEVICE, AND METHOD OF CALIBRATING TRANSFER POSITION DATA IN A PROCESSING SYSTEM

CROSS-REFERENCE TO RELATED APPLICATIONS

This application claims priority to Japanese Patent Application No. 2017-225510 filed on Nov. 24, 2017, the entire contents of which are incorporated herein by reference.

FIELD OF THE INVENTION

The present disclosure relates to a method of obtaining the amount of deviation of a measuring device, and a method of calibrating a transfer position data in a processing system.

BACKGROUND OF THE INVENTION

In manufacturing electronic devices such as semiconductor devices, a processing system for processing a disk-shaped target object is used. The processing system includes a transfer unit for transferring the target object and a processing unit for processing the target object. Generally, the processing unit has a chamber body and a mounting table provided in the chamber body. The mounting table is configured to support the target object mounted thereon. The transfer unit is configured to transfer the target object onto the mounting table.

When the target object is processed by the processing unit, a position of the target object on the mounting table is important. Therefore, when the position of the target object on the mounting table is deviated from a predetermined position, it is required to adjust the transfer unit.

As for a technique for adjusting the transfer unit, there is known a technique described in Japanese Patent Application Publication No. 2017-3557. In the technique described in Japanese Patent Application Publication No. 2017-3557, a measuring device formed in the same disk shape as that of the target object and having an electrode for capacitance measurement is used. In the technique described in Japanese Patent Application Publication No. 2017-3557, the measuring device is transferred onto the mounting table by the transfer unit. The electrostatic capacitance that is dependent on the position of the electrode on the mounting table is measured and the transfer unit is adjusted to correct the transfer position of the target object based on the measurement value.

The above-described measuring device obtains the measurement value of the electrostatic capacitance between the electrode and the target object facing the electrode. The measurement value of the electrostatic capacitance varies depending on the shape of the target object. Even when the positional relation between the target object and the measuring device is the same, different measurement values of the electrostatic capacitances may be obtained due to differences between the target objects or consumption of the target object. Therefore, there is a demand for a method of obtaining the amount of deviation of the measuring device from a desired position with high accuracy from the measurement value of the electrostatic capacitance obtained by the measuring device. Further, there is a demand for a method of calibrating transfer position data in a processing system based on the amount of deviation of the measuring device.

SUMMARY OF THE INVENTION

In accordance with a first aspect, there is provided a method of obtaining the amount of deviation of a central position of a measuring device disposed in a region surrounded by a focus ring from a central position of the region. The measuring device includes: a disk-shaped base substrate; a plurality of sensor electrodes provided on the base substrate; a high frequency oscillator configured to apply a high frequency signal to the plurality of sensor electrodes; and an operation unit configured to calculate a plurality of measurement values indicating electrostatic capacitances of the plurality of sensor electrodes from a plurality of detection values corresponding to potentials of the plurality of sensor electrodes. The plurality of sensor electrodes are provided along a periphery of the base substrate such that a sum A of shortest distances from the plurality of sensor electrodes to an inner peripheral surface of the focus ring becomes a constant value in a state where the measuring device is disposed in the region. The sum A satisfies the following Eq. (1).

$$\sum_{i=1}^{N} \frac{a}{C_i} = A \qquad \text{Eq. (1)}$$

where N represents the number of the plurality of sensor electrodes, $C_i$ represents the plurality of measurement values and "a" represents a constant.

The method comprises: calculating the plurality of measurement values $C_i$ by using the measuring device disposed in the region; calculating the constant "a" in the above equation by using the plurality of calculated measurement values $C_i$; calculating a plurality of distances indicating distances from the plurality of sensor electrodes to the inner peripheral surface of the focus ring by using the calculated constant "a" and the plurality of measurement values $C_i$; and calculating the amount of deviation of the central position of the measuring device based on the plurality of calculated distances.

Each of the measurement values acquired by the measuring device is inversely proportional to the shortest distance between the sensor electrode and the focus ring, and thus is defined as $Ci=a/d$. Here, "d" represents the shortest distance between the sensor electrode and the focus ring. Even if the positional relation between the central position of the focus ring and the central position of the measuring device is the same, the constant "a" varies due to differences between the focus rings or consumption of the focus ring. In the method according to the first aspect, since the sensor electrodes are arranged to satisfy the Eq. (1), the constant "a" is obtained based on the Eq. (1) from the measurement values $C_i$. A plurality of distances can be accurately obtained from the constant "a" and each of the measurement values $C_i$. In accordance with the method according to the first aspect, the amount of deviation of the measuring device can be obtained with high accuracy from the distances thus obtained.

In accordance with a second aspect, there is provided a method of obtaining the amount of deviation of a central position of a measuring device mounted on an electrostatic chuck from a central position of the electrostatic chuck. The measuring device includes: a disk-shaped base substrate; a plurality of sensor electrodes arranged in a circumferential direction about a central axis of the base substrate along a bottom surface of the base substrate; a high frequency oscillator configured to apply a high frequency signal to the plurality of sensor electrodes; and an operation unit configured to calculate a plurality of measurement values indicating electrostatic capacitances of the plurality of sensor electrodes from a plurality of detection values corresponding to potentials of the plurality of sensor electrodes. The electrostatic chuck includes a ceramic main body having a periphery extending in a circumferential direction about a center of the electrostatic chuck and an electrode provided in the main body, and an edge of the electrode of the electrostatic chuck extends at an inner side of the periphery of the main body in the circumferential direction about the center of the electrostatic chuck. Radially outer first edges of the plurality of sensor electrodes extend on a first circle having the same radius as a radius of the periphery of the main body of the electrostatic chuck and having the central axis of the base substrate as its center. Radially inner second edges of the plurality of sensor electrodes extend on a second circle having the same radius as a radius of the edge of the electrode of the electrostatic chuck and having the central axis of the base substrate as its center. The sensor electrodes are provided such that a sum B of shortest distances from the second edges of the plurality of sensor electrodes to the periphery of the electrostatic chuck becomes a constant value in a state where the measuring device is provided on the electrostatic chuck. The sum B satisfies the following Eq. (2).

$$\sum_{i=1}^{M} b \cdot D_i = B \qquad \text{Eq. (2)}$$

where M represents the number of the plurality of sensor electrodes, $D_i$ represents the plurality of measurement values and "b" represents a constant.

The method comprises: calculating the plurality of measurement values $D_i$ by using the measuring device mounted on the electrostatic chuck; calculating the constant "b" in the Eq. (2) by using the plurality of calculated measurement values $D_i$; calculating a plurality of distances indicating distances from the second edges of the plurality of sensor electrodes to the periphery of the electrostatic chuck by using the calculated constant "b" and the plurality of measurement values $D_i$; and calculating the amount of deviation of the central position of the measuring device based on the plurality of calculated distances.

Since the electrostatic capacitance is proportional to the electrode area, each of the measurement values acquired by the measuring device is increased as the shortest distance from the second edge to the periphery of the electrostatic chuck is increased. In other words, each of the measurement values acquired by the measuring device is defined as $D_i=(1/b) \times W_x$. Here, "$W_x$" represents the shortest distance from the second edge to the periphery of the electrostatic chuck. Even if the positional relation between the central position of the electrostatic chuck and the central position of the measuring device is the same, the constant "b" varies due to differences between the electrostatic chucks or consumption of the electrostatic chuck. In the method according to the second aspect, the sensor electrodes are arranged to satisfy the Eq. (2) and, thus, the constant "b" is obtained based on the Eq. (2) from the measurement values $D_i$. A plurality of distances is accurately obtained from the constant "b" and the measurement values $D_i$. In accordance with the method according to the second aspect, the amount of deviation of the measuring device can be obtained with high accuracy from the distances thus obtained.

In accordance with a third aspect, there is provided a method of calibrating transfer position data in a processing system by using the method of the first aspect. The processing system includes: a processing unit having a chamber body and a mounting table provided in a chamber defined by the chamber body; and a transfer unit configured to transfer a target object onto the mounting table and into the region surrounded by the focus ring based on the transfer position data.

The method comprises: transferring the measuring device to a position in the region which is specified by the transfer position data by using the transfer device; calculating the amount of deviation of the central position of the measuring device by using the method described in claim 1; and calibrating the transfer position data by using the amount of deviation of the central position of the measuring device.

In accordance with a fourth aspect, there is provided a method of calibrating transfer position data in a processing system by using the method of the second aspect. The processing system includes: a processing unit having a chamber body and an electrostatic chuck provided in a chamber defined by the chamber body; a transfer unit configured to transfer a target object onto the electrostatic chuck based on the transfer position data.

The method comprises: transferring the measuring device to a position on the electrostatic chuck which is specified by the transfer position data by using the transfer device; calculating the amount of deviation of the central position of the measuring device by using the method described in claim 2; and calibrating the transfer position data by using the amount of deviation of the central position of the measuring device.

In accordance with a fifth aspect, there is provided a method of calibrating transfer position data in a processing system by obtaining the amount of deviation of a central position of a measuring device from a reference position.

The method comprises: selecting as the reference position a central position of a region surrounded by a focus ring or a central position of an electrostatic chuck, transferring the measuring device to a position in the region surrounded by the focus ring or a position on the electrostatic chuck which is specified by the transfer position data; calculating the amount of deviation of the central position of the measuring device from the selected reference position; and calibrating the transfer position data by using the calculated amount of deviation of the central position of the measuring device.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
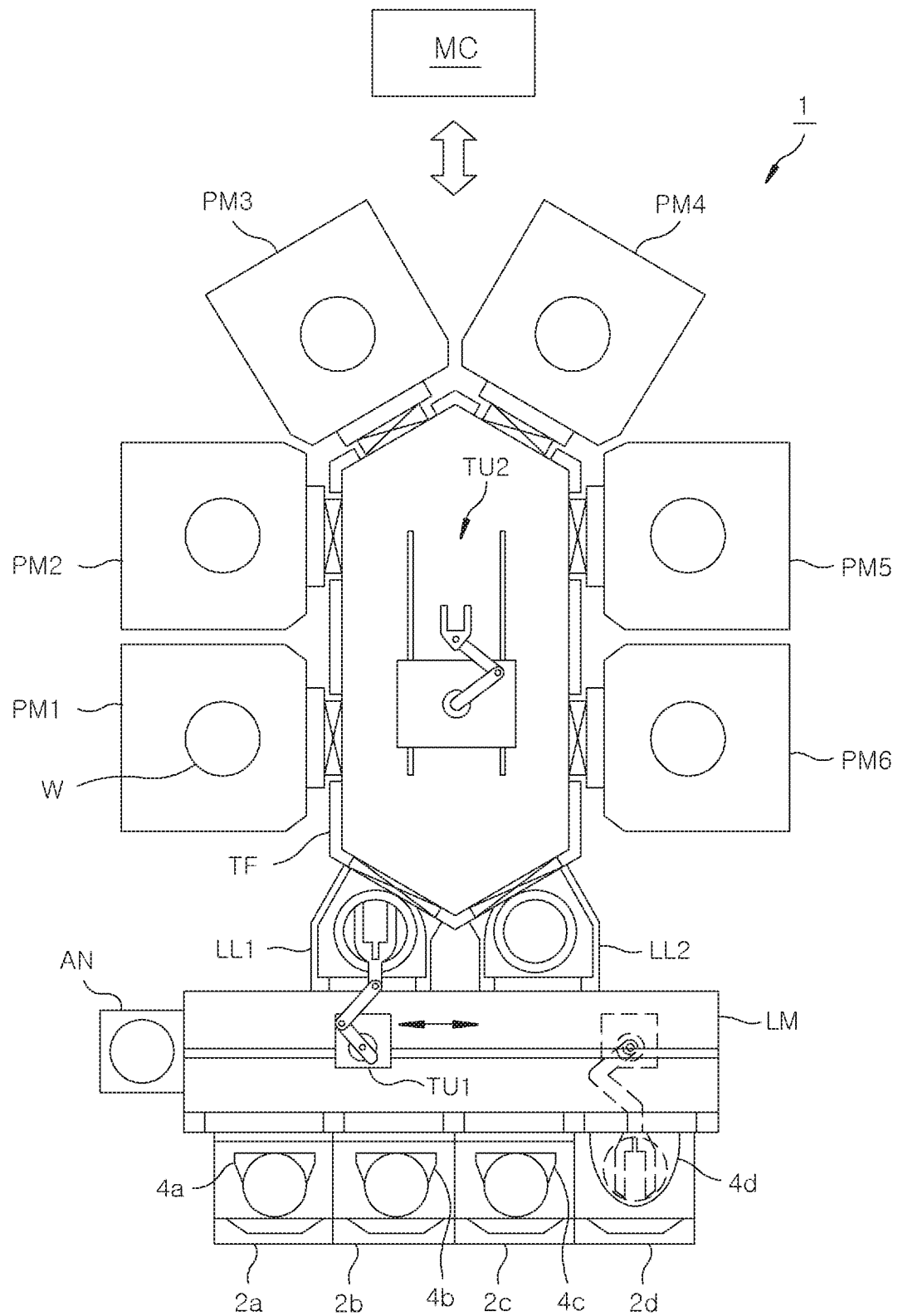
FIG. 1 shows an example of a processing system.

Hereinafter, embodiments will be described in detail with reference to the accompanying drawings. Like reference numerals will be given to like or corresponding parts throughout the drawings.

First, a processing system including a processing device for processing a disk-shaped target object and a transfer device for transferring the target object to the processing device will be described. FIG. 1 shows an example of the processing system. The processing system 1 includes stages 2a to 2d, containers 4a to 4d, a loader module LM, an aligner AN, load-lock modules LL1 and LL2, process modules PM1 to PM6, a transfer module TF, and a control unit MC. The number of the stages 2a to 2d, the number of the containers 4a to 4d, the number of the load-lock modules LL1 and LL2, and the number of the process modules PM1 to PM6 are not limited and may be one or more.

The stages 2a to 2d are arranged along one side of the loader module LM. The containers 4a to 4d are mounted on the stages 2a to 2d, respectively. Each of the containers 4a to 4d is, e.g., a container referred to as FOUP (Front Opening Unified Pod). Each of the containers 4a to 4d is configured to accommodate target objects W. The target object W has a substantially disk shape similar to that of a wafer.

The loader module LM has a chamber wall defining an atmospheric transfer space therein. In this transfer space, a transfer unit TU1 is provided. The transfer unit TU1 is, e.g., a multi-joint robot, and is controlled by the control unit MC. The transfer unit TU1 is configured to transfer the target object W between the containers 4a to 4d and the aligner AN, between the aligner AN and the load-lock modules LL1 to LL2, and between the load-lock modules LL1 to LL2 and the containers 4a to 4d.

Figure 2:
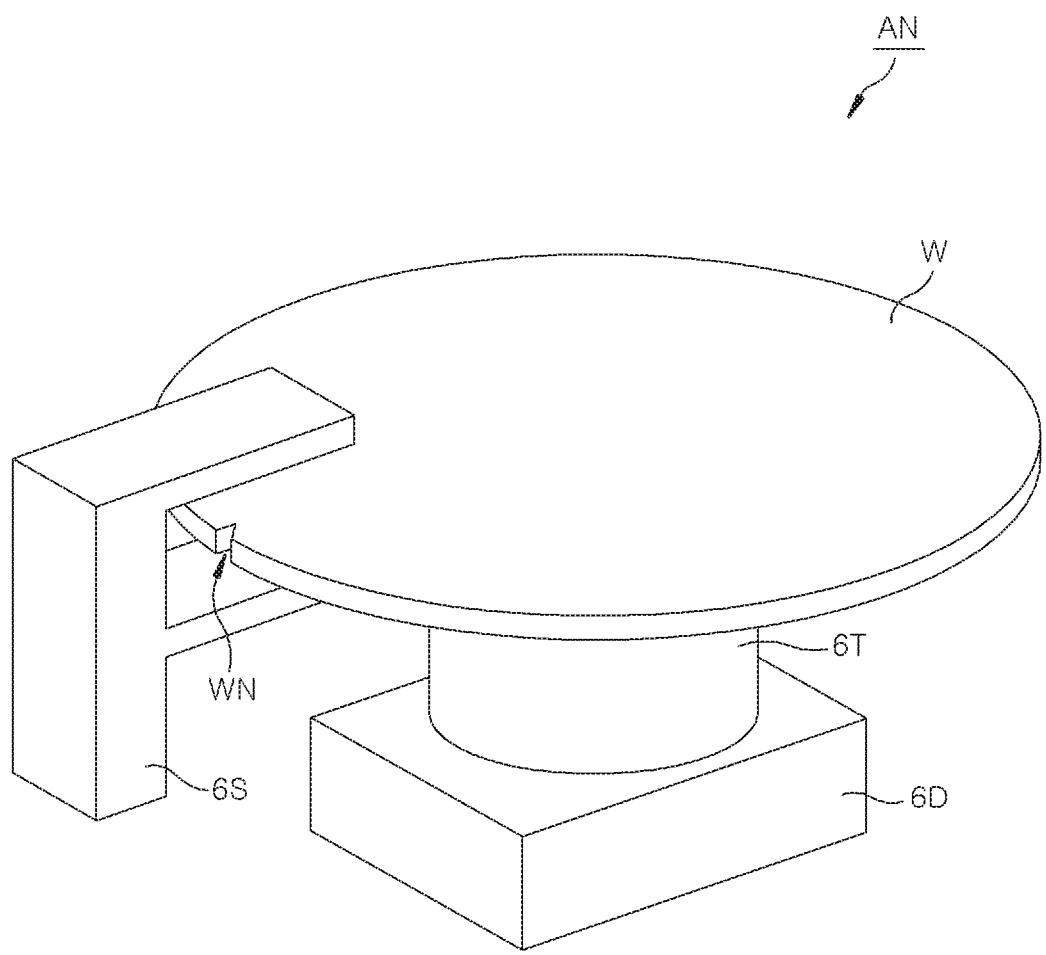
FIG. 2 is a perspective view showing an example of an aligner.

The aligner AN is connected to the loader module LM. The aligner AN is configured to adjust (calibrate) the position of the target object W. FIG. 2 is a perspective view showing an example of the aligner. The aligner AN includes a supporting table 6T, a driving unit 6D, and a sensor 6S. The supporting table 6T is a table that is rotatable about an axis extending in a vertical direction, and is configured to support the target object W thereon. The supporting table 6T is rotated by the driving unit 6D. The driving unit 6D is controlled by the control unit MC. When the supporting table 6T is rotated by power from the driving unite 6D, the target object W mounted on the supporting table 6T is also rotated.

The sensor 6S is an optical sensor, and detects an edge of the target object W during the rotation of the target object W. The sensor 6S detects the amount of deviation of an angular position of a notch WN (or another marker) of the target object W from a reference angular position and the amount of deviation of a central position of the target object W from the reference position based on the edge detection result. The sensor 6S outputs the amount of deviation of the angular position of the notch WN and the amount of deviation of the central position of the target object W to the control unit MC. The control unit MC calculates the amount of rotation of the supporting table 6T which will be used for correcting the angular position of the notch WN to the reference angular position based on the amount of deviation of the angular position of the notch WN. The control unit MC controls the driving unit 6D to rotate the supporting table 6T by the amount of rotation. Accordingly, the angular position of the notch WN can be corrected to the reference angular position. Further, the control unit MC controls a position of an end effector of the transfer unit TU1 at the time of receiving the target object W from the aligner AN based on the amount of deviation of the central position of the target object W such that the central position of the target object W coincides with a predetermined position on the end effector of the transfer unit TU1.

Referring back to FIG. 1, each of the load-lock modules LL1 and LL2 is provided between the loader module LM and the transfer module TF. Each of the load-lock modules LL1 and LL2 provides a preliminary decompression chamber.

The transfer module TF is connected to the load-lock modules LL1 and LL2 through gate valves. The transfer module TF provides a decompressurizable decompression chamber. In this decompression chamber, a transfer unit TU2 is provided. The transfer unit TU2 is, e.g., a multi-joint robot, and is controlled by the control unit MC. The transfer unit TU2 is configured to transfer the target object W between the load-lock modules LL1 and LL2 and the process modules PM1 to PM6 and between any two process modules among the process modules PM1 to PM6.

The process modules PM1 to PM6 are connected to the transfer module TF through gate valves. Each of the process modules PM1 to PM6 is a processing unit configured to perform a dedicated process, such as plasma processing, on the target object W.

The following is description on a series of operations at the time of processing the target object W in the processing system 1. The target object W is unloaded from any one of the containers 4a to 4d and transferred to the aligner An by the transfer unit TU1 of the loader module LM. Next, the transfer unit TU1 transfers the aligned target object W from the aligner AN to one of the load-lock modules LL1 and LL2. Then, a pressure in a preliminary decompression chamber of the load-lock module LL1 or LL2 is decreased to a predetermined level. Thereafter, the target object W is transferred from the load-lock module LL1 or LL2 to one of the process modules PM1 to PM6 by the transfer unit TU2 of the transfer module TF. The target object W is processed in one or more process modules among the process modules PM1 to PM6. Then, the processed target object W is transferred from the process module to one of the load-lock modules LL1 and LL2 by the transfer unit TU2. Then, the target object W is transferred from the load-lock module LL1 or LL2 to one of the containers 4a to 4d by the transfer unit TU1.

As described above, the processing system 1 includes the control unit MC. The control unit MC may be a computer including a processor, a storage unit such as a memory, a display unit, an input/output unit, a communication unit, and the like. The above-described series of operations of the processing system 1 are realized by controlling the respective components of the processing system 1 by the control unit MC based on a program stored in the storage unit.

Figure 3:
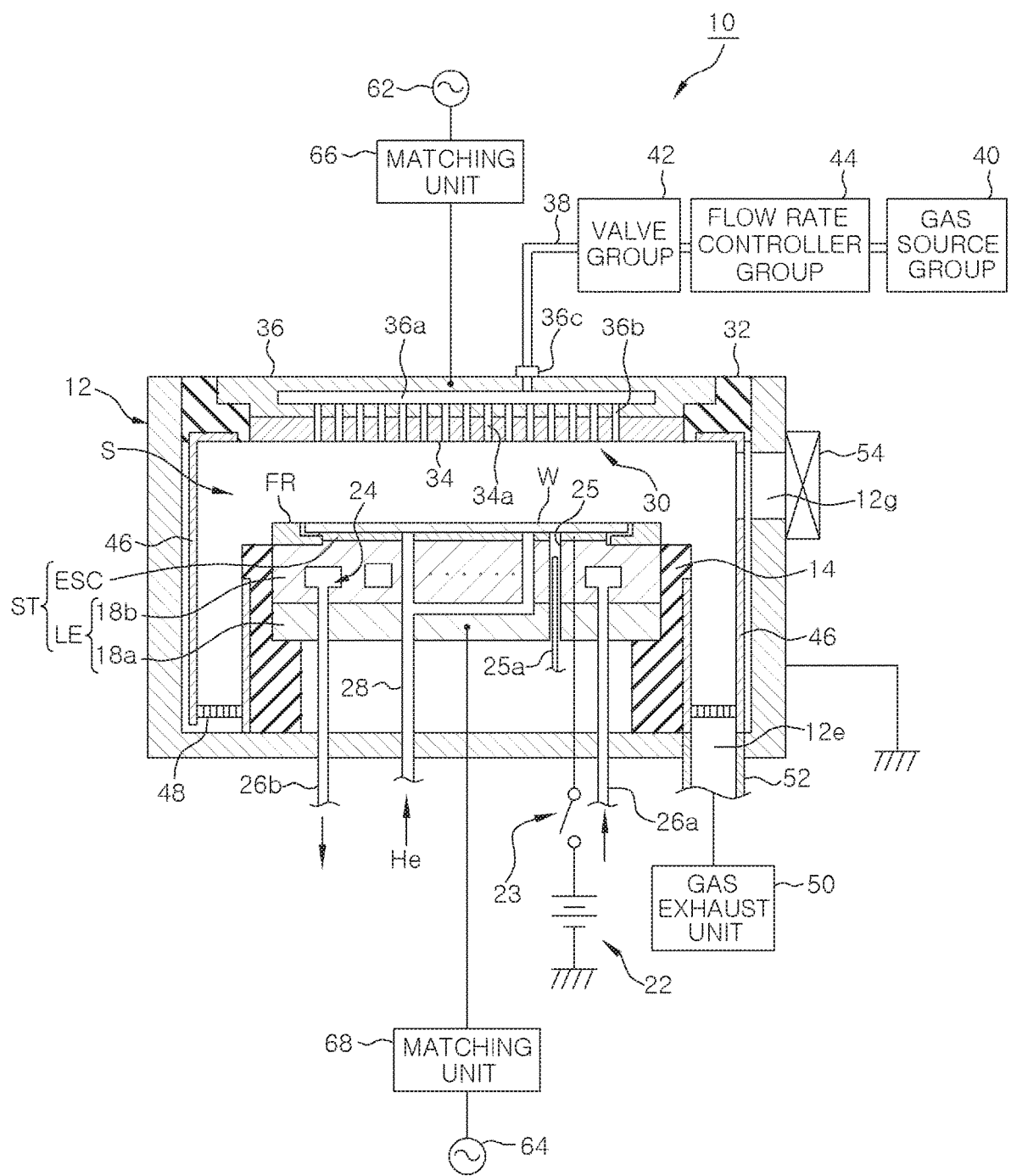
FIG. 3 shows an example of a plasma processing apparatus.

FIG. 3 shows an example of a plasma processing apparatus that may be employed as one of the process modules PM1 to PM6. The plasma processing apparatus 10 shown in FIG. 3 is a capacitively coupled plasma etching apparatus. The plasma processing apparatus 10 includes a substantially cylindrical chamber body 12. The chamber body 12 is made of, e.g., aluminum. Anodic oxidation treatment may be performed on an inner wall surface of the chamber main body 12. The chamber main body 12 is frame grounded.

A substantially cylindrical supporting member 14 is provided on a bottom portion of the chamber main body 12. The supporting member 14 is made of, e.g. an insulating material. The supporting member 14 is provided in the chamber body 12 and extends upward from the bottom portion of the chamber body 12. In a chamber S defined by the chamber main body 12, a stage ST is provided. The stage ST is supported by the supporting member 14.

The stage ST includes a lower electrode LE and an electrostatic chuck ESC. The lower electrode LE has a first plate 18a and a second plate 18b. The first plate 18a and the second plate 18b are made of a metal, e.g., aluminum, and have a substantially disk shape. The second plate 18b is provided on the first plate 18a. The second plate 18b is electrically connected to the first plate 18a.

The electrostatic chuck ESC is provided on the second plate 18b. The electrostatic chuck ESC has a structure in which an electrode that is a conductive film is interposed between two insulating layers or sheets. The electrostatic chuck ESC has a substantially disk shape. A DC power supply 22 is electrically connected to the electrode of the electrostatic chuck ESC via a switch 23. The target object W is attracted and held on the electrostatic chuck ESC by electrostatic force such as Coulomb force or the like which is generated by a DC voltage from the DC power source 22. Accordingly, the target object W can be held on the electrostatic chuck ESC.

A focus ring FR is provided on a peripheral portion of the second plate 18b. The focus ring FR surrounds an edge of the target object W and the electrostatic chuck ESC. The focus ring FR has a first portion P1 and a second portion P2 (see FIG. 7). The first portion P1 and the second portion P2 have an annular plate shape. The second portion P2 is disposed on the first portion P1. A diameter of an inner periphery P2i of the second portion P2 is greater than a diameter of an inner periphery P1i of the first portion P1. The target object W is mounted on the electrostatic chuck ESC such that the edge region thereof is positioned above the first portion P1 of the focus ring FR. The focus ring FR may be made of a material selected among silicon, silicon carbide, silicon oxide, and the like.

A coolant channel 24 is provided in the second plate 18b. The coolant channel 24 constitutes a temperature control mechanism. A coolant is supplied from a chiller unit (not shown) provided outside the chamber main body 12 into the coolant channel 24 through a line 26a. The coolant supplied into the coolant channel 24 is returned to the chiller unit through a line 26b. The coolant circulates between the coolant channel 24 and the chiller unit. By controlling a temperature of the coolant, a temperature of the target object W held on the electrostatic chuck ESC is controlled.

A plurality of (e.g., three) through-holes 25 is formed through the stage ST. A plurality of (e.g., three) lift pins 25a is inserted into the through-holes 25, respectively. FIG. 3 shows one through-hole 25 into which one lift pin 25a is inserted.

The plasma processing apparatus 10 is provided with a gas supply line 28. The gas supply line 28 supplies a heat transfer gas, e.g., He gas, from a heat transfer gas supply mechanism (not shown) to a gap between the upper surface of the electrostatic chuck ESC and the backside of the target object W.

The plasma processing apparatus 10 includes an upper electrode 30. The upper electrode 30 is provided above the stage ST to face the stage ST. The upper electrode 30 is supported at an upper portion of the chamber main body 12 through an insulating shielding member 32. The upper electrode 30 may include a top plate 34 and a holding body 36. The top plate 34 faces the chamber S, and a plurality of gas injection holes 34a is formed in the top plate 34. The top plate 34 may be made of silicon or quartz. Alternatively, the top plate 34 may be formed by forming a plasma resistant film such as yttrium oxide on a surface of an aluminum base material.

The holding body 36 detachably holds the top plate 34, and may be made of a conductive material, e.g., aluminum. The holding body 36 may have a water-cooling structure. A gas diffusion space 36a is provided in the holding body 36. A plurality of gas holes 36b communicating with the gas injection holes 34a extends downward from the gas diffusion space 36a. A gas inlet port 36c for introducing a processing gas to the gas diffusion space 36a is formed at the holding body 36. A gas supply line 38 is connected to the gas inlet port 36c.

A gas source group 40 is connected to the gas supply pipe 38 through a valve group 42 and a flow rate controller group 44. The gas source group 40 includes a plurality of gas sources for a plurality of gases. The valve group 42 includes a plurality of valves, and the flow rate control group 44 includes a plurality of flow rate controllers such as mass flow controllers. A plurality of gas sources of the gas source group 40 is connected to the gas supply line 38 via corresponding valves of the valve group 42 and corresponding flow rate controllers of the flow rate control group 44, respectively.

In the plasma processing apparatus 10, a deposition shield 46 is detachably provided along an inner surface of a sidewall of the chamber main body 12. The deposition shield 46 is also provided at an outer periphery of the supporting member 14. The deposition shield 46 prevents etching by-products (deposits) from being adhered to the chamber main body 12. The deposition shield 46 may be formed by coating ceramic such as yttrium oxide or the like on an aluminum base material.

At a lower portion in the chamber body 12, a gas exhaust plate 48 is provided between the supporting member 14 and the sidewall of the chamber body 12. The gas exhaust plate 48 may be formed by coating ceramic such as yttrium oxide or the like on an aluminum base material, for example. The gas exhaust plate 48 has a plurality of through-holes penetrating therethrough in a plate thickness direction. A gas exhaust port 12e is provided at the chamber main body 12 to be positioned below the gas exhaust plate 48. A gas exhaust unit 50 is connected to the gas exhaust port 12e through the gas exhaust line 52. The gas exhaust unit 50 includes a pressure control valve and a vacuum pump such as a turbo molecular pump or the like, and thus can decrease a pressure in the chamber body 12 to a desired vacuum level. A loading/unloading port 12 for the target object W is provided at the sidewall of the chamber main body 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 MHz to 100 MHz, for plasma generation. The first high frequency power supply 62 is connected to the upper electrode 30 via a matching unit 66. The matching unit 66 includes a circuit for matching an output impedance of the high frequency power supply 62 and an input impedance on a load side (the upper electrode 30 side). The first high frequency power supply 62 may be connected to the lower electrode LE via the matching unit 66.

The second high frequency power supply 64 generates a second high frequency power, which has a high frequency of, e.g., 400 kHz to 13.56 MHz, for attracting ions to the target object W. The second high frequency power supply 64 is connected to the lower electrode LE via a matching unit 68. The matching unit 68 includes a circuit for matching an output impedance of the second high frequency power supply 64 and an input impedance of a load side (the lower electrode LE side).

In the plasma processing apparatus 10, a gas from one or more gas sources selected among the gas sources is supplied into the chamber S. A pressure in the chamber S is set to a predetermined pressure by the gas exhaust unit 50. The gas in the chamber S is excited by the first high frequency power from the first high frequency power supply 62 to generate plasma. The target object W is processed by active species. If necessary, ions may be attracted to the target object W by the second high frequency power for bias of the second high frequency power supply 64.

Figure 4:
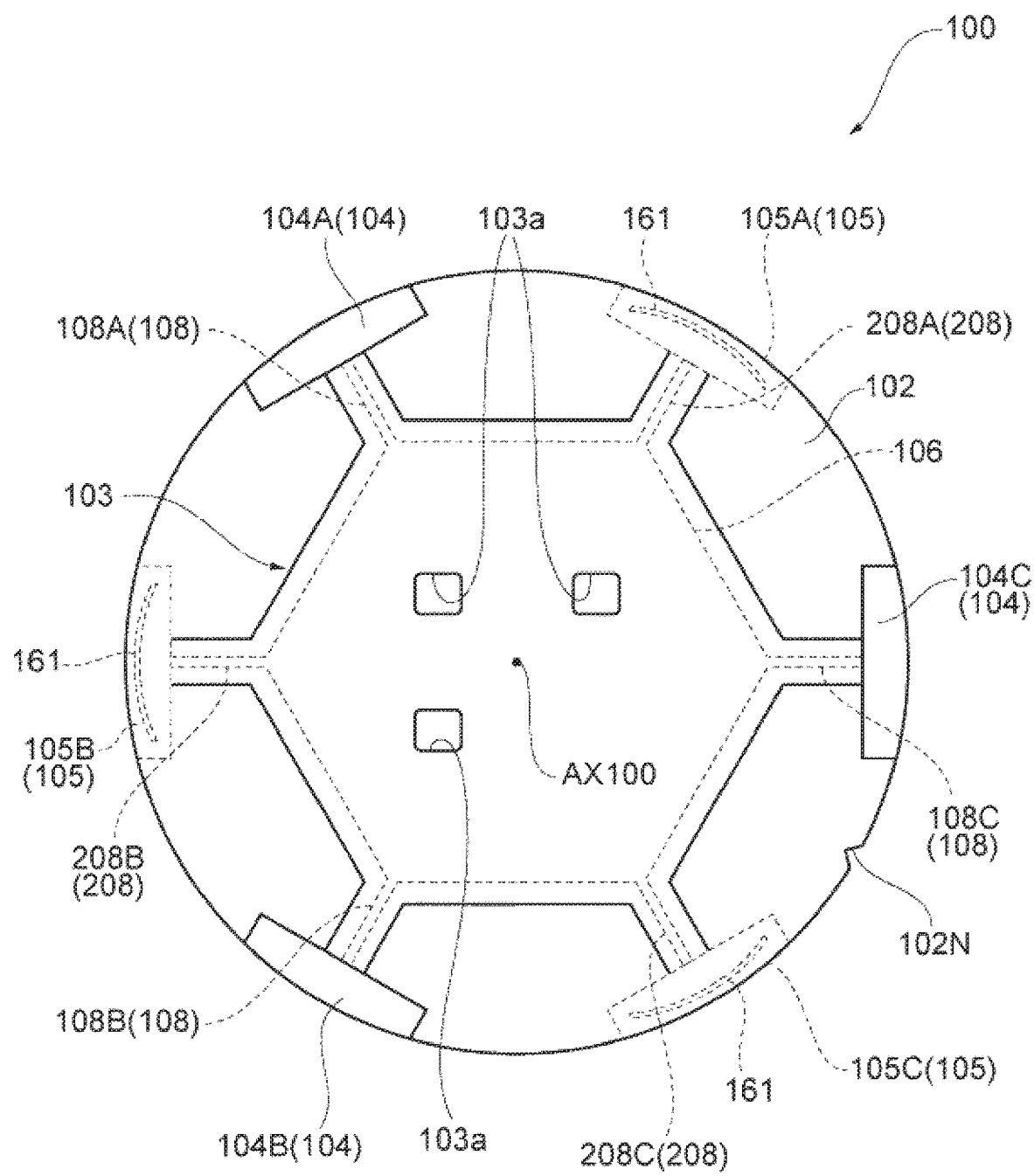
FIG. 4 is a plan view of a measuring device when viewed from the top.
Figure 5:
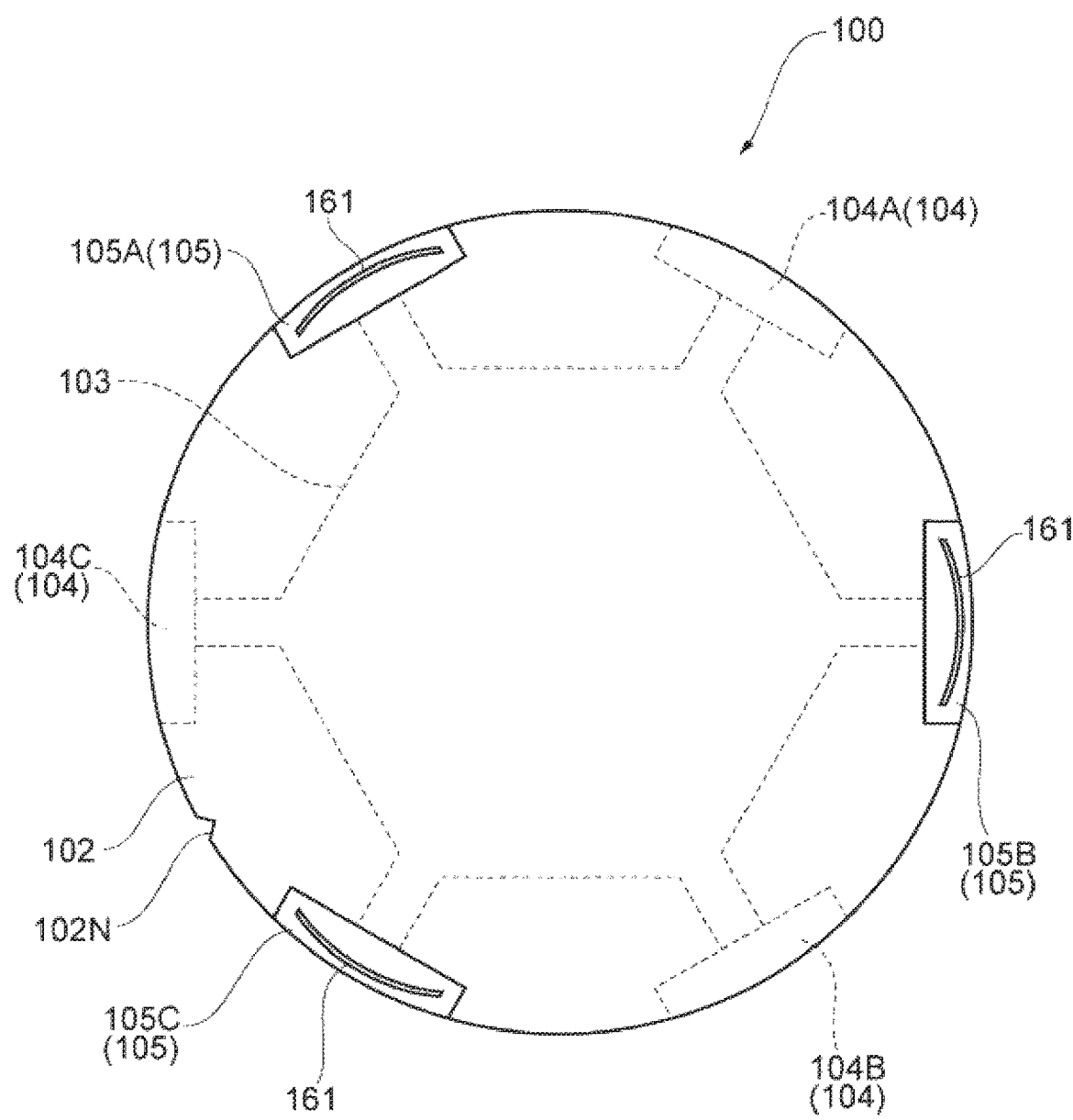
FIG. 5 is a plan view of the measuring device when viewed from the bottom.

Hereinafter, the measuring device will be described. FIG. 4 is a plan view of the measuring device viewed from the top. FIG. 5 is a plan view of the measuring device viewed from the bottom. A measuring device 100 shown in FIGS. 4 and 5 includes a base substrate 102. The base substrate 102 is made of, e.g., silicon, and formed in the same shape as that of the target object W, i.e., a substantially disk shape. A diameter of the base substrate 102 is the same as that of the target object W, e.g., 300 mm. The shape and the size of the measuring device 100 may be defined by the shape and the size of the base substrate 102. Therefore, the measuring device 100 has the same shape and the same size as those of the target object W. A notch 102N (or another marker) is formed at an edge of the base substrate 102.

The base substrate 102 is provided with a plurality of first sensors 104A to 104C for electrostatic capacitance measurement. The first sensors 104A to 104C are arranged at a regular interval along the edge of the base substrate 102 in the entire circumference of the edge. Specifically, each of the first sensors 104A to 104C is provided along the edge on the upper surface of the base substrate. Front end surfaces 104f of the first sensors 104A to 104C are provided along the side surface of the base substrate 102.

In addition, the base substrate 102 is provided with a plurality of second sensors 105A to 105C for electrostatic capacitance measurement. The second sensors 105A to 105C are arranged at a regular interval along the edge of the base substrate 102 in the entire circumference of the edge. Specifically, each of the second sensors 105A to 105C is provided along the edge on the bottom surface of the base substrate. Sensor electrodes 161 of the second sensors 105A to 105C are provided along the bottom surface of the base substrate 102. The second sensors 105A to 105C and the first sensors 104A to 104C are alternately arranged at an interval of 60° in the circumferential direction.

A circuit board 106 is provided at a central portion of the upper surface of the base substrate 102. Wiring groups 108A to 108C for electrically connecting the circuit board 106 and the first sensors 104A to 104C are provided therebetween. Wiring groups 208A to 208C for electrically connecting the circuit board 106 and the second sensors 105A to 105C are provided therebetween. The circuit board 106, the wiring groups 108A to 108C, and the wiring groups 208A to 208C are covered with a cover 103. The cover 103 is provided with a plurality of openings 103a. The positions of the openings 103a coincide with those of power supply connectors 177a, which will be described later, arranged on the circuit board 106 or the like.

Figure 6:
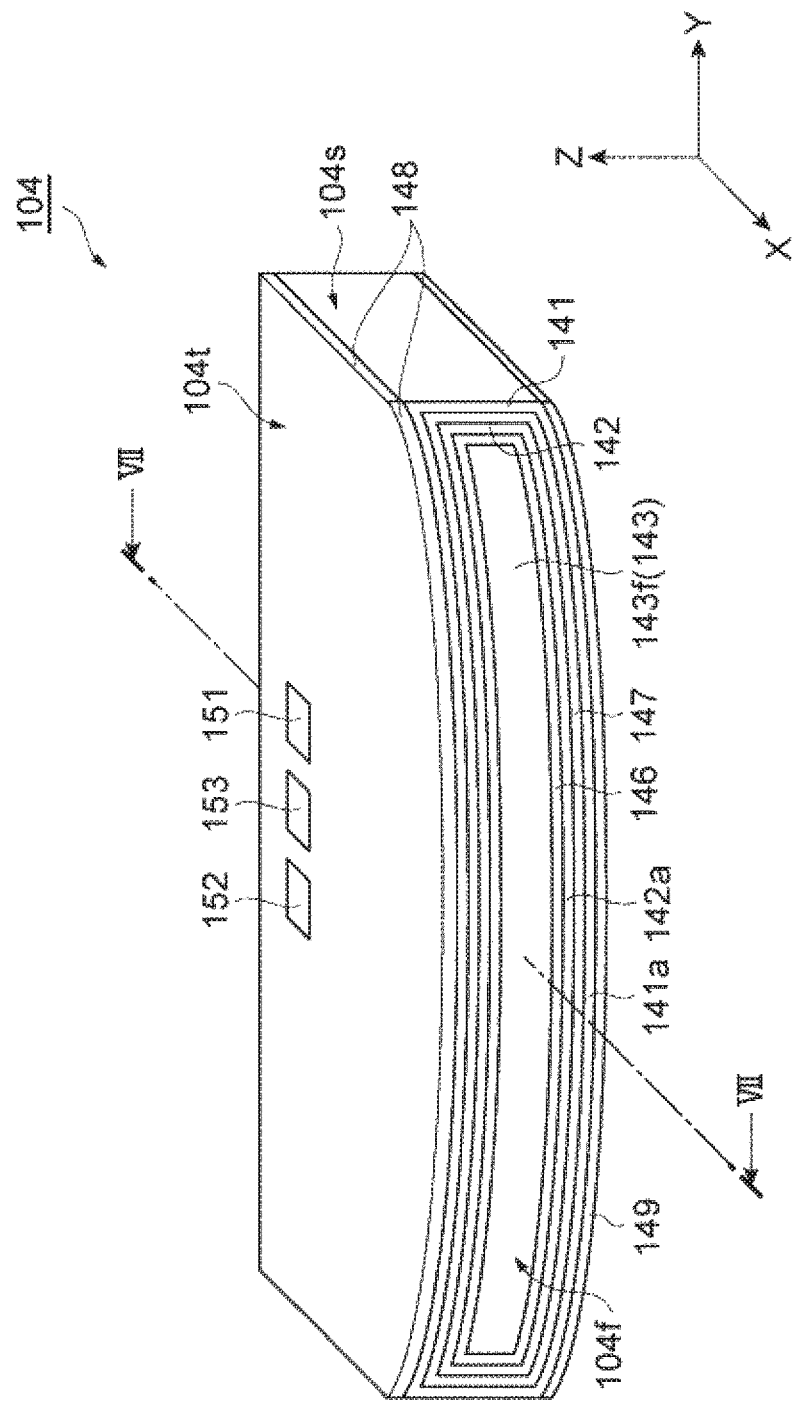
FIG. 6 is a perspective view showing an example of a first sensor.
Figure 7:
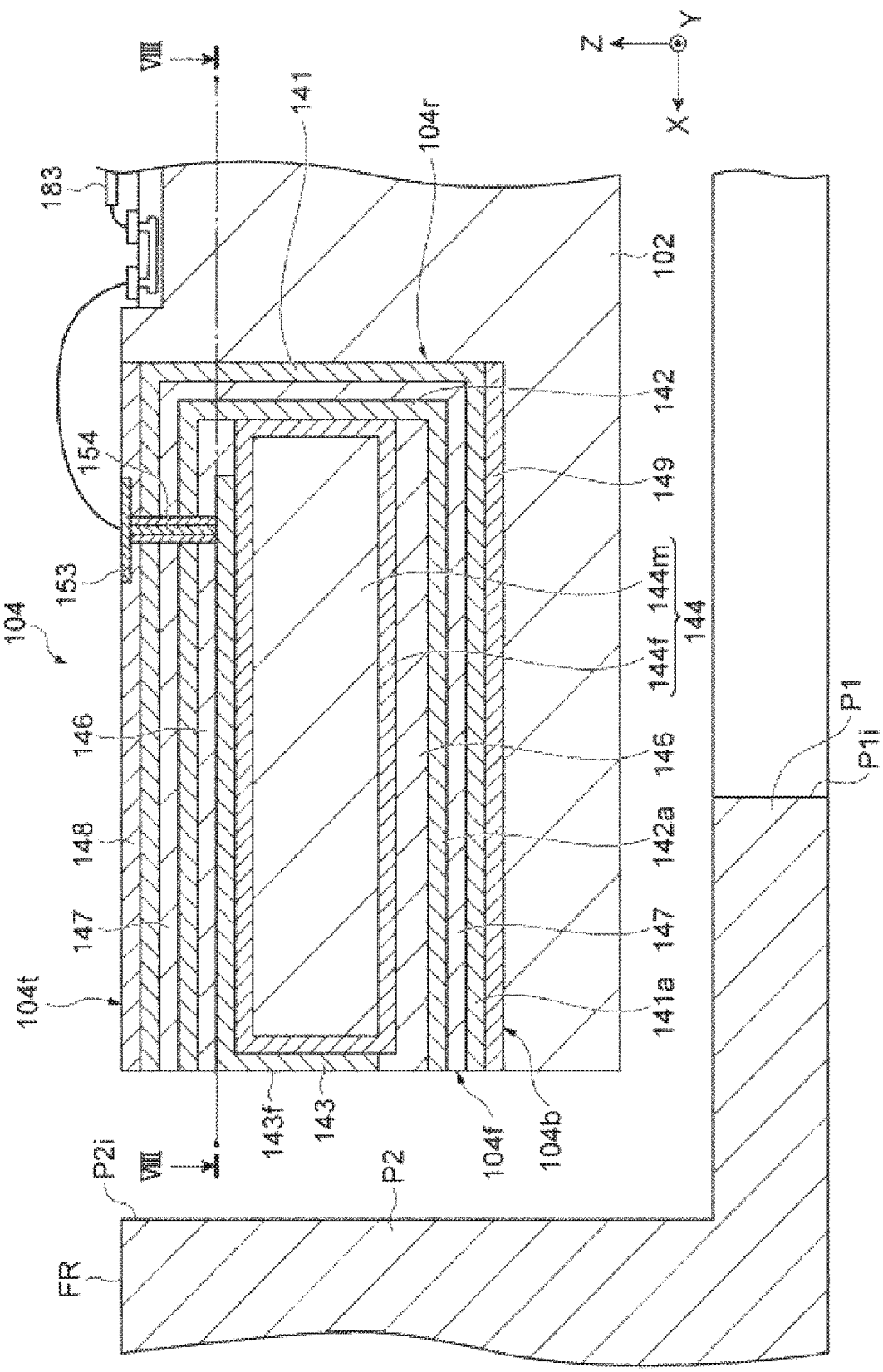
FIG. 7 is a cross sectional view taken along a line VII-VII of FIG. 6.
Figure 8:
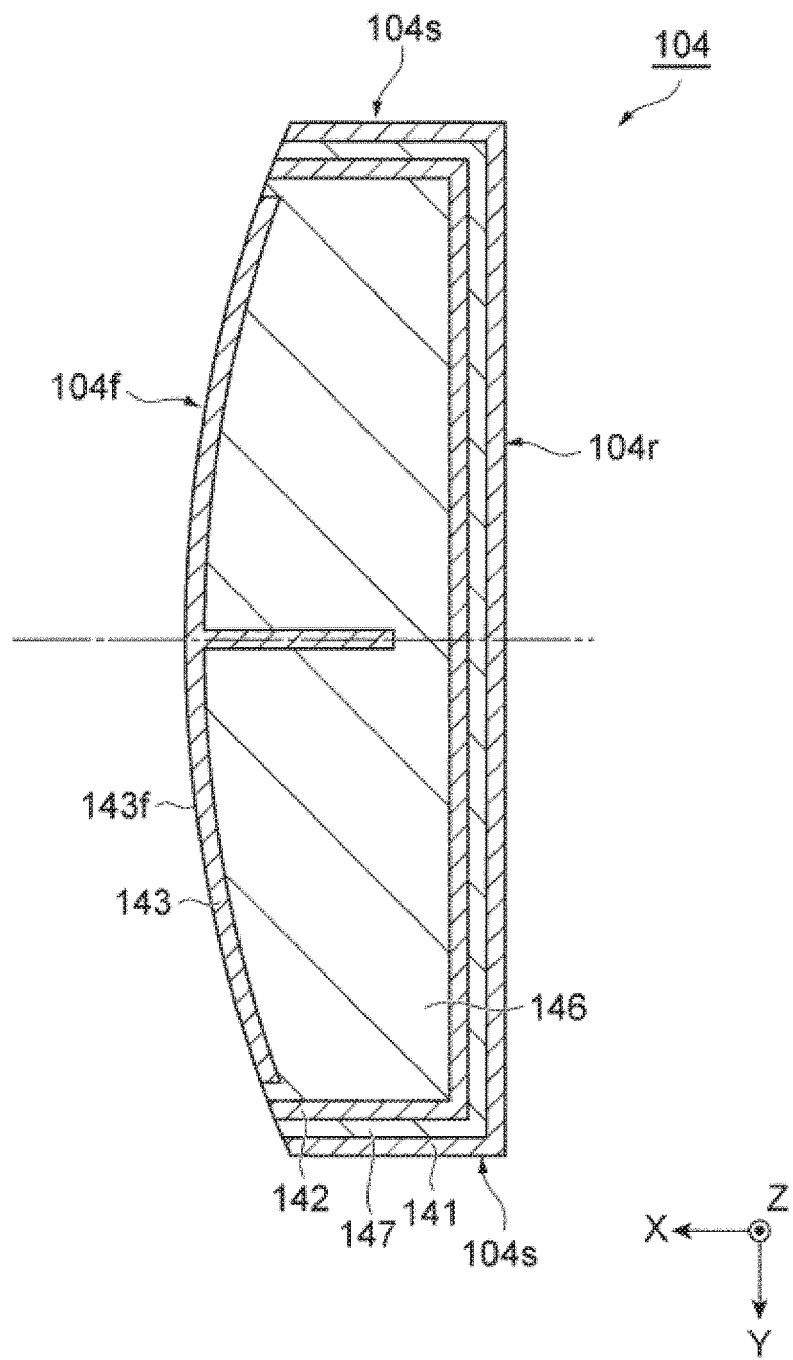
FIG. 8 is a cross sectional view taken along a line VIII-VIII of FIG. 7.

Hereinafter, the first sensor will be described in detail. FIG. 6 is a perspective view showing an example of a sensor. FIG. 7 is a cross sectional view taken along a line VII-VII of FIG. 6. FIG. 8 is a cross sectional view taken along a line VIII-VIII of FIG. 7. The first sensor 104 shown in FIGS. 6 to 8 is used as the first sensor 104A to 104C of the measuring device 100. In one example, the first sensor 104 is configured as a chip-shaped component. In the following description, the XYZ orthogonal coordinate system will be appropriately referred to. The X direction indicates a frontward direction of the first sensor 104. The Y direction indicates a width direction of the first sensor 104 which is orthogonal to the X direction. The Z direction indicates an upward direction of the first sensor 104 which is orthogonal to the X direction and the Y direction.

As shown in FIGS. 6 to 8, the first sensor 104 has a front end surface 104f, an upper surface 104t, a lower surface 104b, a pair of side surfaces 104s, and a rear end surface 104r. The front side end surface 104f forms a front surface of the first sensor 104 in the X direction. The first sensor 104 is mounted on the base substrate 102 of the measuring device 100 such that the front end surface 104f is radially directed with respect to the central axis AX100 (see FIG. 4). In a state where the first sensor 104 is mounted on the base substrate 102, the front end surface 104f extends along the edge of the base substrate 102. Therefore, when the measuring device 100 is disposed on the electrostatic chuck ESC, the front end surface 104f faces an inner periphery of the focus ring FR.

The rear end surface 104r forms a rear surface of the first sensor 104 in the X direction. In a state where the first sensor 104 is mounted on the base substrate 102, the rear end surface 104r is positioned closer to the central axis AX100, compared to the front end surface 104f. The upper surface 104t forms a top surface of the first sensor 104 in the Z direction, and the lower surface 104b forms a bottom surface of the first sensor 104 in the Z direction. The pair of side surfaces 104s form the surfaces of the first sensor 104 in the Y direction.

The first sensor 104 includes a sensor electrode 143. The first sensor 104 may further include an electrode 141 and a guard electrode 142. The electrode 141 is made of a conductor. The electrode 141 has a first portion 141a. As shown in FIGS. 6 and 7, the first portion 141a extends in the X direction and the Y direction.

The guard electrode 142 is made of a conductor. The guard electrode 142 has a second portion 142a. The second portion 142a extends above the first portion 141a. In the first sensor 104, the guard electrode 142 is insulated from the electrode 141. As shown in FIGS. 6 and 7, the second portion 142a extends in the X direction and the Y direction on the first portion 141a.

The sensor electrode 143 is made of a conductor. The sensor electrode 143 is provided above the first portion 141a of the electrode 141 and the second portion 142a of the guard electrode 142. The sensor electrode 143 is insulated from the electrode 141 and the guard electrode 142 in the first sensor 104. The sensor electrode 143 has a front surface 143f. The front surface 143f extends in a direction intersecting with the first portion 141a and the second portion 142a. Further, the front face 143f extends along the front end face 104f of the first sensor 104. In one embodiment, the front face 143f forms a part of the front end surface 104f of the first sensor 104. Alternatively, the first sensor 104 may have an insulating film covering the front surface 143f in front of the front surface 143f of the sensor electrode 143.

As shown in FIGS. 6 to 8, the electrode 141 and the guard electrode 142 may open toward a region (X direction) where the front surface 143f of the sensor electrode 143 is disposed and extend to surround the sensor electrode 143. In other words, the electrode 141 and the guard electrode 142 may extend to surround the sensor electrode 143 from all sides except the front side of the sensor electrode 143.

Further, the front end surface 104f of the first sensor 104 may be a curved surface having a predetermined curvature. In that case, the front end surface 104f has a constant curvature at any position thereof, and the curvature of the front end surface 104f may be a reciprocal of a distance between the central axis AX100 of the measuring device 100 and the front end surface 104f. The first sensor 104 is mounted on the base substrate 102 such that the center of curvature of the front end surface 104f coincides with the central axis AX100.

The first sensor 104 may further include a substrate member 144, insulating regions 146 to 148, pads 151 to 153, and a via wiring 154. The substrate member 144 has a main body portion 144m and a surface layer portion 144f. The main body portion 144m is made of, e.g., silicon. The surface layer portion 144f covers the surface of the main body portion 144m. The surface layer portion 144f is made of an insulating material. The surface layer portion 144f is, e.g., a thermal oxide film of silicon.

The second portion 142a of the guard electrode 142 extends below the substrate member 144. The insulating region 146 is provided between the substrate member 144 and the guard electrode 142. The insulating region 146 is made of, e.g., $SiO_2$, $SiN$, $Al_2O_3$, or polyimide.

The first portion 141a of the electrode 141 extends below the substrate member 144 and second portion 142a of the guard electrode 142. The insulating region 147 is provided between the electrode 141 and the guard electrode 142. The insulating region 147 is made of, e.g., $SiO_2$, $SiN$, $Al_2O_3$, or polyimide.

The insulating region 148 forms the upper surface 104t of the first sensor 104. The insulating region 148 is made of, e.g., $SiO_2$, $SiN$, $Al_2O_3$, or polyimide. The pads 151 to 153 are formed in the insulating region 148. The pad 153 is made of a conductor and connected to the sensor electrode 143. Specifically, the sensor electrode 143 and the pad 153 are connected to each other by the via wiring 154 extending through the insulating region 146, the guard electrode 142, the insulating region 147, and the electrode 141. An insulator is provided around the via wiring 154, and the via wiring 154 is insulated from the electrode 141 and the guard electrode 142. The pad 153 is connected to the circuit board 106 through a wiring 183 provided in the base substrate 102. The pads 151 and 152 are also made of a conductor. The pad 151 and the pad 152 are connected to the electrode 141 and the guard electrode 142 through corresponding via wirings, respectively. Further, the pads 151 and 152 are connected to the circuit board 106 through corresponding wirings provided on the base substrate 102.

Figure 9:
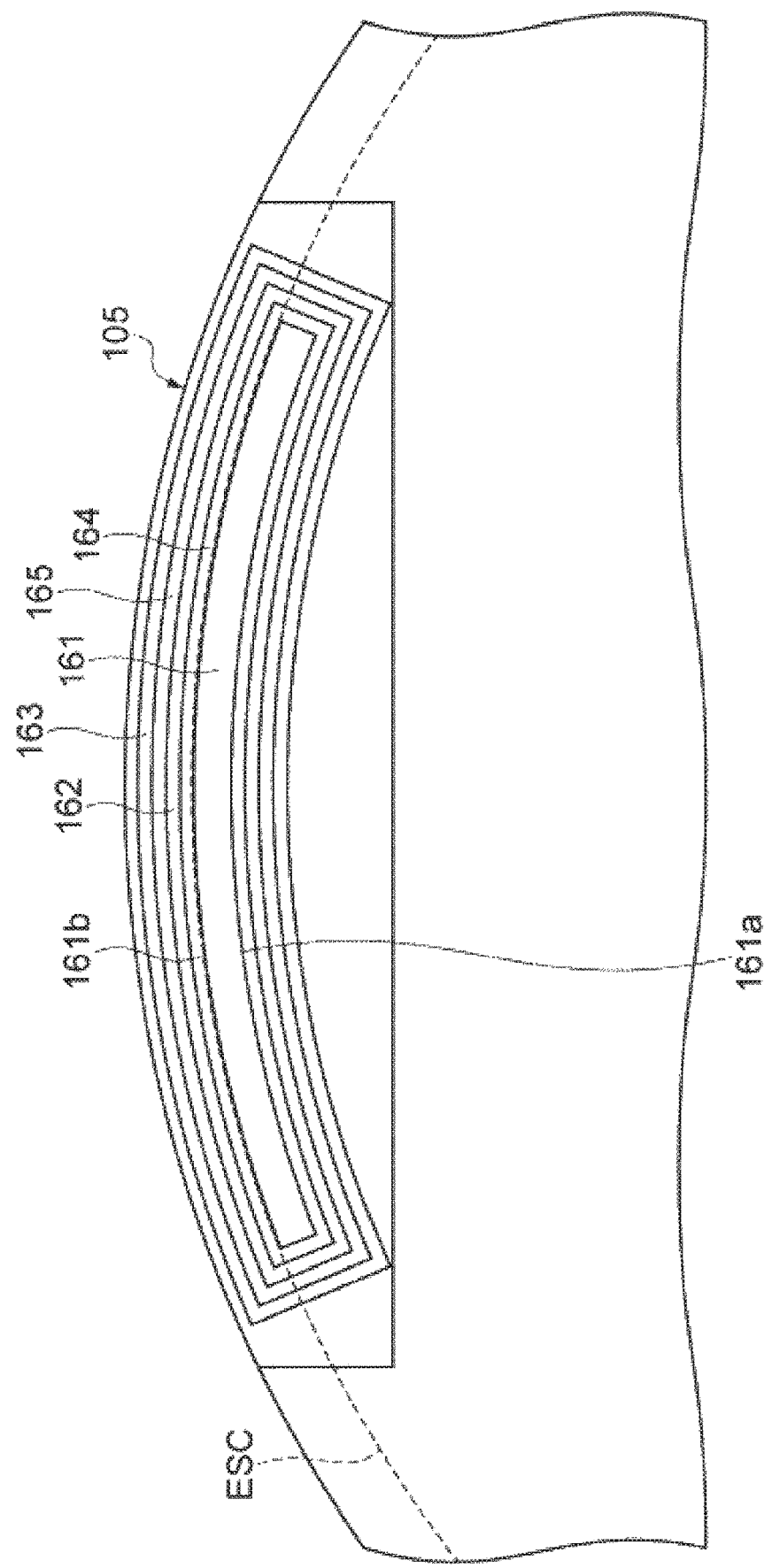
FIG. 9 is an enlarged view of a second sensor shown in FIG. 5.

Hereinafter, the second sensor will be described in detail. FIG. 9 is a partially enlarged view of FIG. 5, and shows a single second sensor. The edge of the sensor electrode 161 has partially a circular arc shape. In other words, the sensor electrode 161 has a planar shape defined by two circular arcs, i.e., an inner edge (second edge) 161a and an outer edge (first edge) 161b, having different radii about the central axis AX100. The radially outer edges 161b of the sensor electrodes 161 of the second sensors 105A to 105C extend on a common circle. The radially inner edges 161a of the sensor electrodes 161 of the second sensors 105A to 105C extend on another common circle. A curvature of a part of the edge of the sensor electrode 161 coincides with the curvature of the edge of the electrostatic chuck ESC. In one embodiment, the curvature of the outer edge 161b forming the radial outer edge of the sensor electrode 161 coincides with the curvature of the edge of the electrostatic chuck ESC. The center of curvature of the outer edge 161b, i.e., the center of the circle on which the outer edge 161b extends, shares the central axis AX100.

In one embodiment, each of the second sensors 105A to 105C further includes a guard electrode 162 surrounding the sensor electrode 161. The guard electrode 162 has a frame shape and surrounds the entire periphery of the sensor electrode 161. The guard electrode 162 and the sensor electrode 161 are separated from each other with an insulating region 164 interposed therebetween. Further, in one embodiment, each of the second sensors 105A to 105C further includes an electrode 163 surrounding the guard electrode 162. The electrode 163 has a frame shape and surrounds the entire periphery of the guard electrode 162. The guard electrode 162 and the electrode 163 are separated from each other with an insulating region 165 interposed therebetween.

Figure 10:
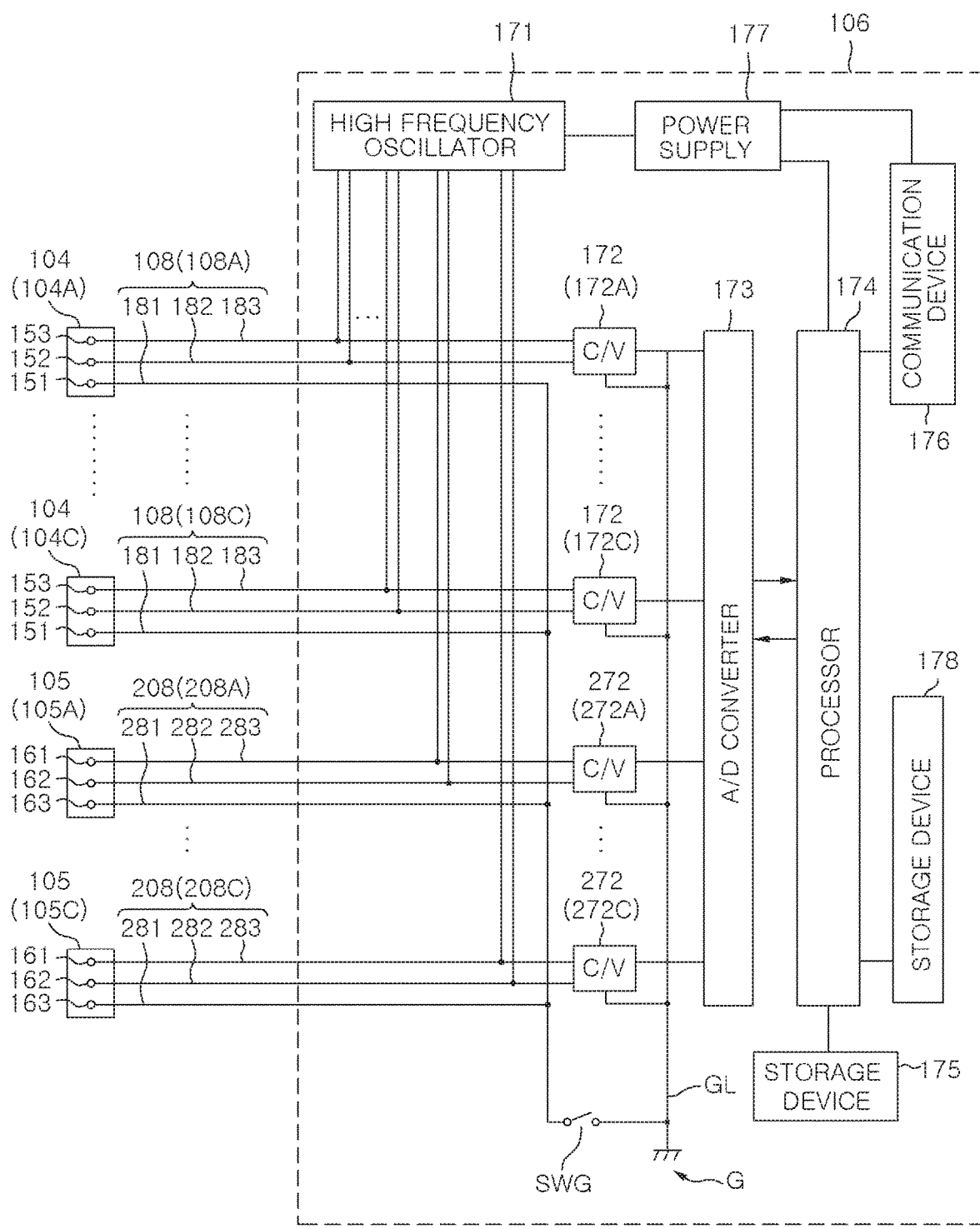
FIG. 10 shows an example of a configuration of a circuit board of a measuring device.

Hereinafter, the configuration of the circuit board 106 will be described. FIG. 10 shows an example of the configuration of the circuit board of the measuring device 10. As shown in FIG. 10, the circuit board 106 includes a high frequency oscillator 171, a plurality of C/V conversion circuits 172A to 172C, a plurality of C/V conversion circuits 272A to 272C, an A/D converter 173, a processor (operation unit) 174, a storage device 175, a communication device 176, and a power supply 177.

Each of the first sensors 104A to 104C is connected to the circuit board 106 through a corresponding wiring group among the wiring groups 108A to 108C. Further, each of the first sensors 104A to 104C is connected to a corresponding one among the C/V conversion circuits 172A to 172C through some wirings included in the corresponding wiring group. Each of the second sensors 105A to 105C is connected to the circuit board 106 through a corresponding wiring group among the wiring groups 208A to 208C. Further, each of the second sensors 105A to 105C is connected to a corresponding one among the C/V conversion circuits 272A to 272C through some wirings included in the corresponding wiring group.

The following is description on a single first sensor 104 having the same configuration as that of each of the first sensors 104A to 104C, a single wiring group 108 having the same configuration as that of each of the wiring groups 108A to 108C, a single C/V conversion circuit 172 having the same configuration as that of each of the C/V conversion circuits 172A to 172C, a single second sensor 105 having the same configuration as that of each of the second sensors 105A to 105C, a single wiring group 208 having the same configuration as that of each of the wiring groups 208A to 208C, and a single C/V conversion circuit 272 having the same configuration as that of each of the C/V conversion circuits 272A to 272C.

The wiring group 108 includes wirings 181 to 183. One end of the wiring 181 is connected to the pad 151 connected to the electrode 141. The wiring 181 is connected to the ground potential line GL connected to a ground G of the circuit board 106. The wiring 181 may be connected to the ground potential line GL via a switch SWG. One end of the wiring 182 is connected to the pad 152 connected to the guard electrode 142, and the other end of the wiring 182 is connected to the C/V conversion circuit 172. One end of the wiring 183 is connected to the pad 153 connected to the sensor electrode 143, and the other end of the wiring 183 is connected to the C/V conversion circuit 172.

The wiring group 208 includes wirings 281 to 283. One end of the wiring 281 is connected to the electrode 163. The wiring 281 is connected to the ground potential line GL connected to the ground G of the circuit board 106. The wiring 281 may be connected to the ground potential line GL via the switch SWG. One end of the wiring 282 is connected to the guard electrode 162, and the other end of the wiring 282 is connected to the C/V conversion circuit 272. One end of the wiring 283 is connected to the sensor electrode 161, and the other end of the wiring 283 is connected to the C/V conversion circuit 272.

The high frequency oscillator 171 is connected to the power supply 177 such as a battery. The high frequency oscillator 171 is configured to receive power from the power supply 177 and generate a high frequency signal. The power supply 177 is also connected to the processor 174, the storage device 175, and the communication device 176. The high frequency oscillator 171 has a plurality of output lines. The high frequency oscillator 171 is configured to apply the generated high frequency signal to the wirings 182, 183, 282 and 283 through the output lines. Therefore, the high frequency oscillator 171 is electrically connected to the guard electrode 142 and the sensor electrode 143 of the first sensor 104, and the high frequency signal from the high frequency oscillator 171 is applied to the guard electrode 142 and the sensor electrode 143. Further, the high-frequency oscillator 171 is electrically connected to the sensor electrode 161 and the guard electrode 162 of the second sensor 105, and the high frequency signal from the high frequency oscillator 171 is applied to the sensor electrode 161 and the guard electrode 162.

The wirings 182 and 183 are connected to an input of the C/V conversion circuit 172. In other words, the guard electrode 142 and the sensor electrode 143 of the first sensor 104 are connected to the input of the C/V conversion circuit 172. The sensor electrode 161 and the guard electrode 162 are connected to an input of the C/V conversion circuit 272, respectively. The C/V conversion circuits 172 and 272 are configured to generate a voltage signal having an amplitude corresponding to the potential difference at the input thereof and output the corresponding voltage signal. As the electrostatic capacitance of the sensor electrode connected to the C/V conversion circuit 172 is increased, the magnitude of the voltage signal outputted from the C/V conversion circuit 172 is increased. Similarly, as the electrostatic capacitance of the sensor electrode connected to the C/V conversion circuit 272 is increased, the magnitude of the voltage signal outputted from the C/V conversion circuit 272 is increased. The high frequency oscillator 171, the wirings 282 and 283, and the C/V conversion circuit 272 are connected in the same manner as in the high frequency oscillator 171, the wirings 182 and 183, and the C/V conversion circuit 172.

The outputs of the C/V conversion circuits 172 and 272 are connected to the input of the A/D converter 173. The A/D converter 173 is connected to the processor 174. The A/D converter 173 is controlled by a control signal from the processor 174. The A/D converter 173 converts the output signals (voltage signal) of the C/V conversion circuits 172 and 272 to digital values and outputs the digital values as detection values to the processor 174.

The storage device 175 is connected to the processor 174. The storage device 175 may be a volatile memory and is configured to store measurement data to be described later. Another storage device 178 is also connected to the processor 174. The storage device 178 may be a nonvolatile memory and is configured to store a program that is read out and executed by the processor 174.

The communication device 176 conforms to any wireless communication standard. For example, the communication device 176 conforms to Bluetooth (registered trademark). The communication device 176 is configured to wirelessly transmit the measurement data stored in the storage device 175.

The processor 174 is configured to control the respective components of the measuring device 100 by executing the above-described program. For example, the processor 174 is configured to control the supply of the high frequency signal from the high frequency oscillator 171 to the guard electrode 142, the sensor electrodes 143 and 161, and the guard electrode 162, the supply of power from the power supply 177 to the storage device 175, the supply of power from the power supply 177 to the communication device 176, and the like. Further, the processor 174 executes the above-described program and acquires the measurement values of the first sensor 104 and the second sensor 105 based on the detection values inputted from the A/D converter 173.

In the measuring device 100 described above, the sensor electrodes 143 and the guard electrodes 142 face the inner periphery of the focus ring FR in a state where the measuring device 100 is disposed in a region surrounded by the focus ring FR. The measurement value generated based on the potential difference between the signal of the sensor electrode 143 and the signal of the guard electrode 142 indicates the electrostatic capacitance reflecting the distance between each of the sensor electrodes 143 and the focus ring. The electrostatic capacitance C is represented by $C=\varepsilon S/d$. "$\varepsilon$" represents a dielectric constant of a medium between the front surface $143f$ of the sensor electrode 143 and the inner periphery of the focus ring FR; "S" represents an area of the front surface $143f$ of the sensor electrode 143; "d" represents a distance between the front surface $143f$ of the sensor electrode 143 and the inner periphery of the focus ring FR. Therefore, in accordance with the measuring device 100, the measurement data reflecting the relative positional relation between the focus ring FR and the measuring device 100 that imitates the target object W is obtained. For example, the plurality of measurement values obtained by the measuring device 100 is decreased as the distance between the front surface 143f of the sensor electrode 143 and the inner periphery of the focus ring FR is increased.

In a state where the measuring device 100 is mounted on the electrostatic chuck ESC, the sensor electrodes 161 face the electrostatic chuck ESC. When the sensor electrode 161 is deviated radially outward with respect to the electrostatic chuck ESC, the electrostatic capacitance measured by the sensor electrode 161 becomes smaller than that measured at the time of transferring the measuring device 100 to a predetermined transfer position. When the sensor electrode 161 is radially deviated inward with respect to the electrostatic chuck ESC, the electrostatic capacitance measured by the sensor electrode 161 becomes greater than that measured at the time of transferring the measuring device 100 to the predetermined transfer position.

The following is description on a method of obtaining the amount of deviation of the central position (central axis AX100) of the measuring device 100 disposed in a region surrounded by the focus ring FR with respect to the central position (central axis AXF) of the corresponding region.

Figure 11:
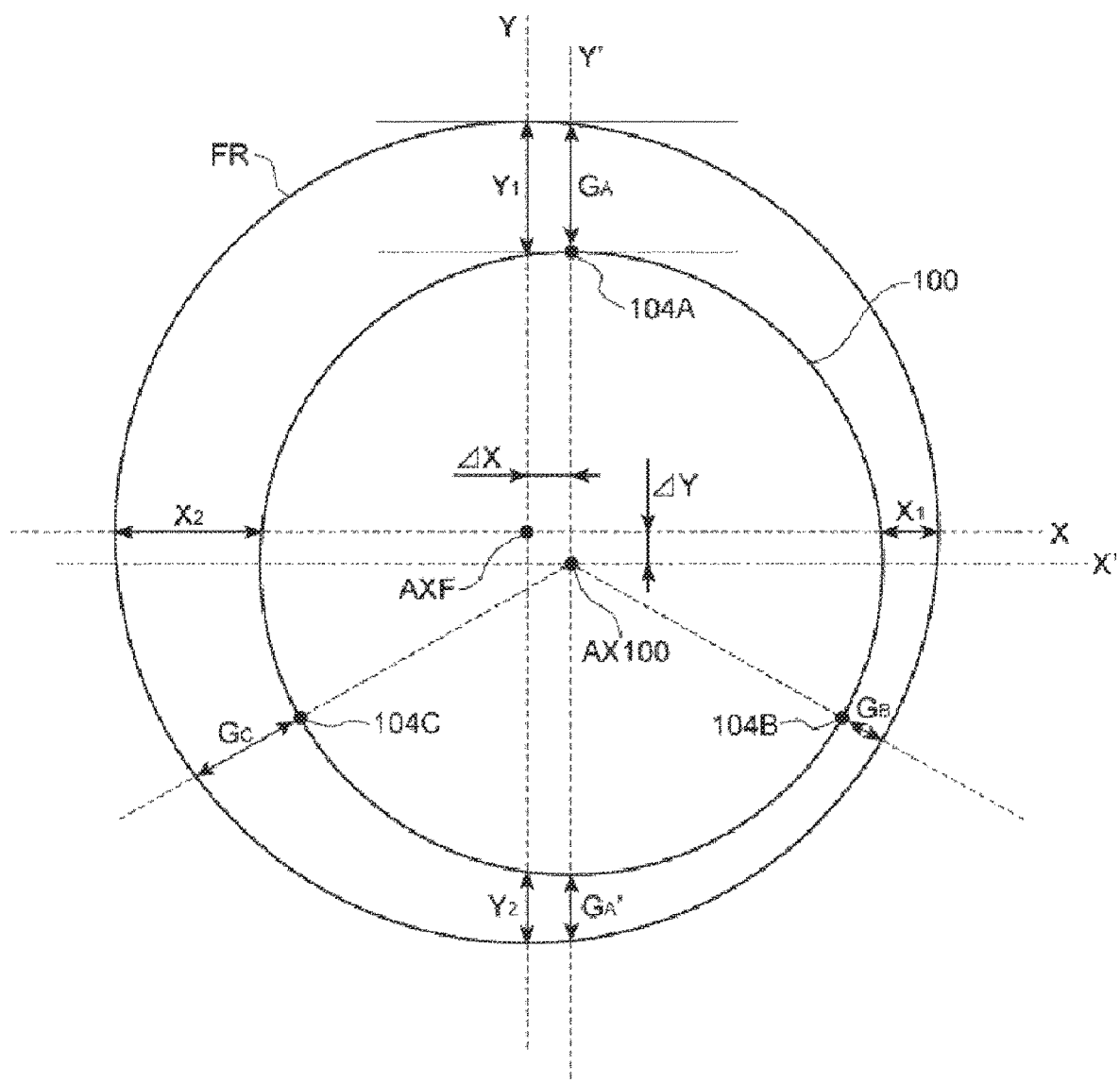
FIG. 11 schematically shows positional relation between a focus ring and the measuring device.

FIG. 11 schematically shows positional relation between the focus ring FR and the measuring device 100 disposed at an inner side of the focus ring FR. In FIG. 11, an inner periphery of the focus ring FR and an edge of the measuring device 100 are shown. Further, in FIG. 11, an orthogonal coordinate system having the X-axis and the Y-axis with the central axis AXF of the focus ring FR as the origin and an orthogonal coordinate system having the X'-axis and the Y'-axis with the central axis AX100 of the measuring device 100 as the origin are shown. In the illustrated example, the Y'-axis is set to pass through the first sensor 104A.

As shown in FIG. 11, the amount of deviation between the central axis AXF of the focus ring FR and the central axis AX100 of the measuring device 100 is indicated by $\Delta X$ and $\Delta Y$. Hereinafter, a method of deriving $\Delta X$ and $\Delta Y$ will be described. In one embodiment, three first electrodes sensors 104A to 104C are arranged at a regular interval of 120° in the circumference direction along the periphery of the base substrate 102 so that the sum A of shortest distances from the sensor electrodes 143 to the inner peripheral surface of the focus ring FR becomes a constant value. In the illustrated example, an inner diameter $D_f$ of the focus ring FR is 302 mm and an outer diameter $D_w$ of the measuring device 100 is 300 mm. In that case, on the assumption that the shortest distances from the first sensors 104A, 104B and 104C to the inner peripheral surface of the focus ring FR are respectively $G_A$, $G_B$ and $G_C$, the following Eq. (3) is satisfied.

$$((D_f - D_w)/2) \times 3 = G_A + G_B + G_C = 3.00 \text{ mm} \quad \text{Eq. (3)}$$

Since the electrostatic capacitance C is represented by $C = \varepsilon S/d$ as described above, the distance d is represented by $d = \varepsilon S/C$. If "$\varepsilon S$" is a constant "a", the distance d is expressed by $d = a/C$. Since the distance d corresponds to $G_A$, $G_B$ and $G_C$ in the above Eq. (3), on the assumption that measurement values (electrostatic capacitances) of the first sensor 104A, 104B and 104C are respectively $C_A$, $C_B$ and $C_C$, conditions $G_A = a/C_A$, $G_B = a/C_B$, and $G_C = a/C_C$ are satisfied. In other words, the Eq. (3) is converted into the following Eq. (4).

$$(a/C_A) + (a/C_B) + (a/C_C) = 3.00 \text{ mm} \quad \text{Eq. (4)}$$

The Eq. (4) can be generalized to the following Eq. (5). In other words, on the assumption that measurement values of the N-number of first sensors 104 are $C_i$ ($i = 1, 2, 3, \ldots, N$), the following Eq. (5) is satisfied. When the sum A of the shortest distances from the N-number of first sensors 104 to the inner peripheral surface of the focus ring FR is a constant value, the sum A can be calculated by $((D_f - D_w)/2) \times N$.

$$\sum_{i=1}^{N} \frac{a}{C_i} = A \quad \text{Eq. (5)}$$

In the case of deriving $\Delta X$ and $\Delta Y$, first, the measurement values $C_A$, $C_B$, and $C_C$ of the first sensors 104A to 104C are acquired. By substituting these measurement values $C_A$, $C_B$, and $C_C$ into the Eq. (4), the constant "a" can be obtained. Then, the distances $G_A$, $G_B$, and $G_C$ are derived based on the constant "a" and the measurement values $C_A$, $C_B$, and $C_C$.

When a difference between the inner diameter $D_f$ of the focus ring FR and the outer diameter $D_w$ of the measuring device 100 is sufficiently smaller than the inner diameter $D_f$ of the focus ring FR as in the present embodiment, $G_A$ can be approximated as a distance $Y_1$ from the inner periphery of the focus ring FR to the edge of the measuring device 100. In other words, the following Eq. (6) is satisfied.

$$G_A \approx Y_1 \quad \text{Eq. (6)}$$

On the assumption that the distance from the position symmetrical to the first sensor 104A with respect to the origin (the central axis AX100) to the inner periphery of the focus ring FR is $G_A'$, $G_A'$ can be approximated as a distance $Y_2$ from the inner periphery of the focus ring FR to the edge of the measuring device 100. In other words, the following Eq. (7) is satisfied.

$$G_A' \approx Y_2 \quad \text{Eq. (7)}$$

Here, $Y_1$ and $Y_2$ represent distances on the Y-axis. Therefore, the sum of $Y_1$ and $Y_2$ can be approximated as a difference between the inner diameter $D_f$ of the focus ring FR and the outer diameter $D_w$ of the measuring device 100. In other words, the following Eq. (8) is satisfied based on the Eqs. (6) and (7).

$$Y_1 + Y_2 \approx G_A + G_A' \approx 2 \quad \text{Eq. (8)}$$

Since $\Delta Y$ can be defined as ½ of the difference between $Y_2$ and $Y_1$, $\Delta Y$ can be obtained from the distance $G_A$ as shown in the following Eq. (9).

$$\Delta Y = (Y_2 - Y_1)/2 = 1 - G_A \quad \text{Eq. (9)}$$

Similarly, on the assumption that the distances from the edge of the measuring device 100 to the inner periphery of the focus ring FR on the X-axis are $X_1$ and $X_2$, the following Eq. (10) is satisfied.

$$X_1 + X_2 \approx 2 \quad \text{Eq. (10)}$$

A ratio between the shortest distance $G_B$ from the first sensor 104B to the focus ring FR and the shortest distance $G_C$ from the first sensor 104C to the focus ring FR is expressed by the following Eq. (11).

$$X_1 : X_2 = G_B : G_C \quad \text{Eq. (11)}$$

Here, if the condition $G_C + G_B = Z$ is satisfied, $X_1$ and $X_2$ are expressed by the following Eqs. (12) and (13) from the Eqs. (10) and (11), respectively.

$$X_1 = 2G_B/Z = 2G_B/(G_C + G_B) \quad \text{Eq. (12)}$$

$$X_2 = 2G_C/Z = 2G_C/(G_C + G_B) \quad \text{Eq. (13)}$$

Therefore, $\Delta X$ can be defined as the following Eq. (14) and, thus, $\Delta X$ can be obtained from the distances $G_C$ and $G_B$.

$$\Delta X=(X_2-X_1)/2=(G_C-G_B)/(G_C+G_B) \qquad \text{Eq. (14)}$$

As described above, in one embodiment, the amount of deviation between the central axis AXF of the focus ring FR and the central axis AX100 of the measuring device 100 disposed at the inner side of the focus ring FR can be calculated as the amount of deviation ΔX in the X-axis direction and the amount of deviation ΔY in the Y-axis direction.

Next, a method of obtaining the amount of deviation between the central position (the central axis AXE) of the electrostatic chuck ESC and the central axis AX100 of the measuring device 100 disposed on the electrostatic chuck ESC will be described.

Figure 12:
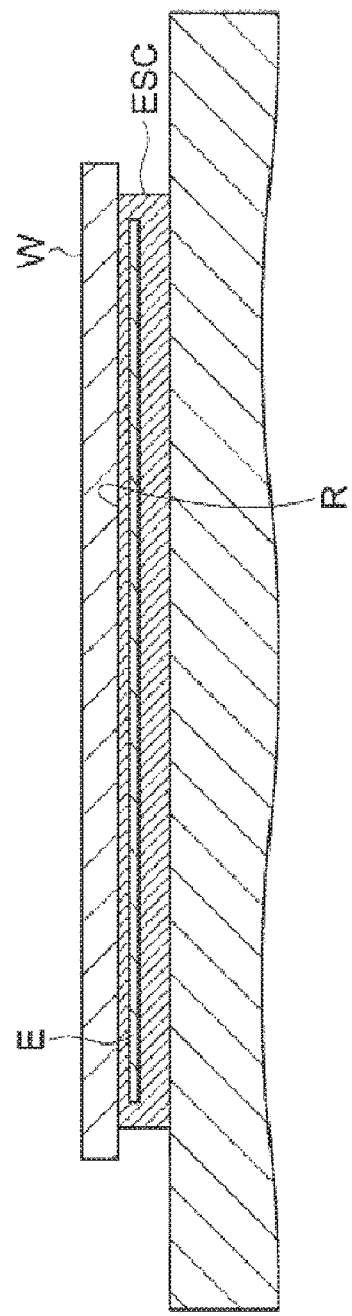
FIG. 12 is a cross sectional view schematically showing an electrostatic chuck.

FIG. 12 is a cross sectional view of the electrostatic chuck, and shows a state in which the target object is mounted on the electrostatic chuck. In one embodiment, the electrostatic chuck ESC has a ceramic main body and an electrode E provided in the main body. The main body is formed in a circular plate shape and has a periphery extending in the circumferential direction with respect to the center of the electrostatic chuck ESC. The electrode E has a circular plate shape, and the edge of the electrode E extends at an inner side of the periphery of the main body in the circumferential direction with respect to the center of the electrostatic chuck ESC. The electrostatic chuck ESC has a mounting region R on which the target object W and the measuring device 100 are mounted. The mounting region R has a circular edge. The target object W and the measuring device 100 have an outer diameter greater than that of the mounting region R.

Figure 13A:
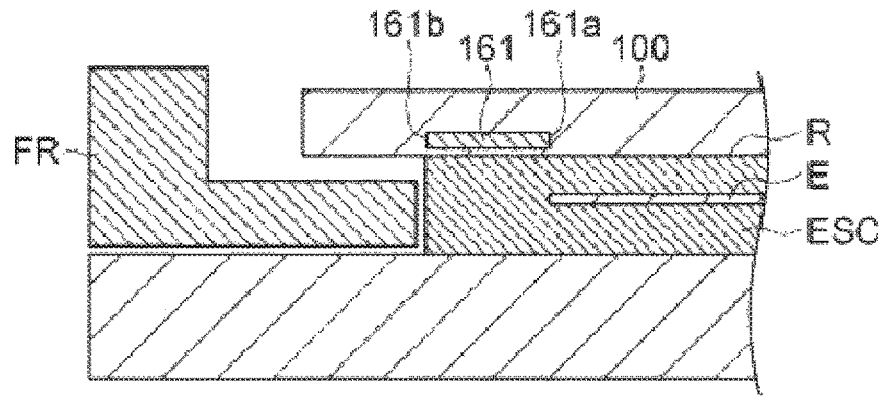
FIGS. 13A to 13C are cross sectional views schematically showing positional relation between the electrostatic chuck and the measuring device.
Figure 13B:
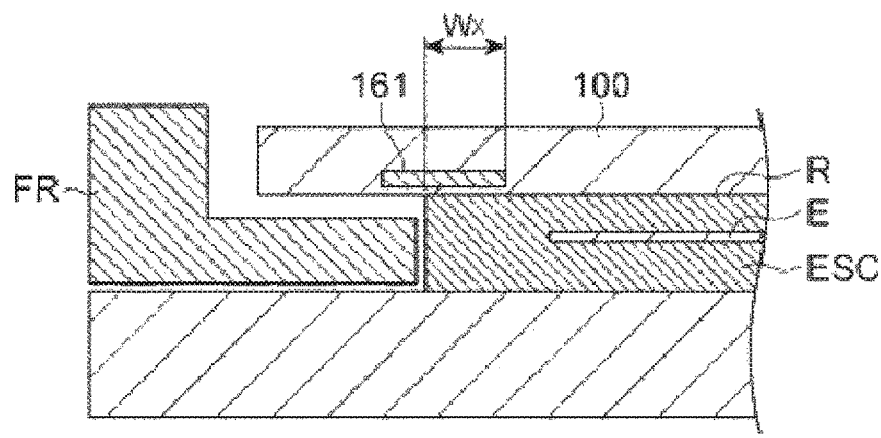
Figure 13C:
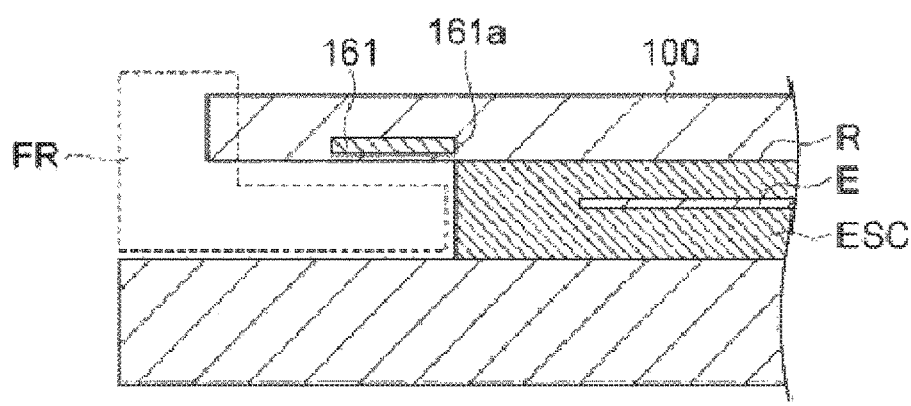

FIGS. 13A to 13C show the transfer position of the measuring device with respect to the mounting region of the electrostatic chuck. FIG. 13A shows the arrangement in the case where the central position of the measuring device 100 coincides with the central position of the electrostatic chuck. FIGS. 13B and 13C show the arrangement in the case where the central position of the measuring device 100 is deviated from the central position of the electrostatic chuck. In FIG. 13C, the focus ring FR and the measuring device 100 interfere with each other. In other words, the arrangement shown in FIG. 13C cannot be obtained in actual cases.

As shown in FIG. 13A, when the central axis AX100 of the measuring device 100 coincides with the central axis AXE of the electrostatic chuck ESC, the outer edge 161b (see FIG. 9) of the sensor electrode 161 coincides with the outer edge of the electrostatic chuck ESC. In that case, the inner edge 161a (see FIG. 9) of the sensor electrode 161 may coincide with the outer edge of the electrode E. In other words, the outer edge 161b of the sensor electrode 161 extends on a first circle centered on the central axis AX100, and the first circle has the same radius as that of the periphery of the main body of the electrostatic chuck ESC. The inner edge 161a of the sensor electrode 161 extends on a second circle centered on the central axis AX100, and the second circle has the same radius as that of the periphery of the electrode E of the electrostatic chuck ESC.

As described above, the electrostatic capacitance C is represented by C=εS/d. Here, the distance d is a constant distance from the sensor electrode 161 to the surface of the electrostatic chuck ESC. "S" represents an area of a portion where the sensor electrode 161 and the electrostatic chuck ESC face each other. Therefore, "S" varies depending on the positional relation between the measuring device 100 and the electrostatic chuck ESC. For example, as shown in FIG. 13B, "S" is reduced in the arrangement in which an overlap length $W_x$ between the sensor electrode 161 and the electrostatic chuck ESC is reduced. Here, the overlap length can be defined as the shortest distance from the periphery of the electrostatic chuck ESC to the inner edge 161a of the sensor electrode 161.

The shape of the sensor electrode 161 can be approximated as a rectangle having sides along a diametrical direction of a circle centered on the central axis AX100 and sides orthogonal to the diametrical direction. In that case, "S" is indicated by the product of the length of the side orthogonal to the diametrical direction and the overlap length $W_x$. On the assumption that the length of the side orthogonal to the diametrical direction is $S_a$, "S" is indicated by the product of $S_a$ and $W_x$. In that case, the equation C=εS/d can be converted into an equation C=ε·Sa·$W_x$/d. Therefore, the overlap length $W_x$ is expressed by the following Eq. (15).

$$W_x=(d/(\varepsilon \cdot S_a))C \qquad \text{Eq. (15)}$$

By setting $d/(\varepsilon \cdot S_a)$ to a constant "b", the following Eq. (16) is derived.

$$W_x=b \cdot C \qquad \text{Eq. (16)}$$

As shown in FIG. 13C, when the inner edge 161a of the sensor electrode 161 coincides with the outer edge of the electrostatic chuck ESC, the overlap length $W_x$ becomes zero. In that case, the electrostatic capacitance C measured by the sensor electrode 161 theoretically becomes zero. Therefore, in the present embodiment, the second sensor 105 is calibrated so that the electrostatic capacitance C becomes zero when the overlap length $W_x$ is zero. On the other hand, when the sensor electrode 161 moves toward the central axis AXE of the electrostatic chuck ESC from the state shown in FIG. 13A, the overlap length $W_x$ becomes greater than the diametrical length of the sensor electrode 161. In that case, even if the overlap length $W_x$ is increased, the value of "S" is not changed. Since, however, the electrode E is arranged on the electrostatic chuck ESC, the electrostatic capacitance C may be increased as the overlap length $W_x$ is increased.

Figure 14:
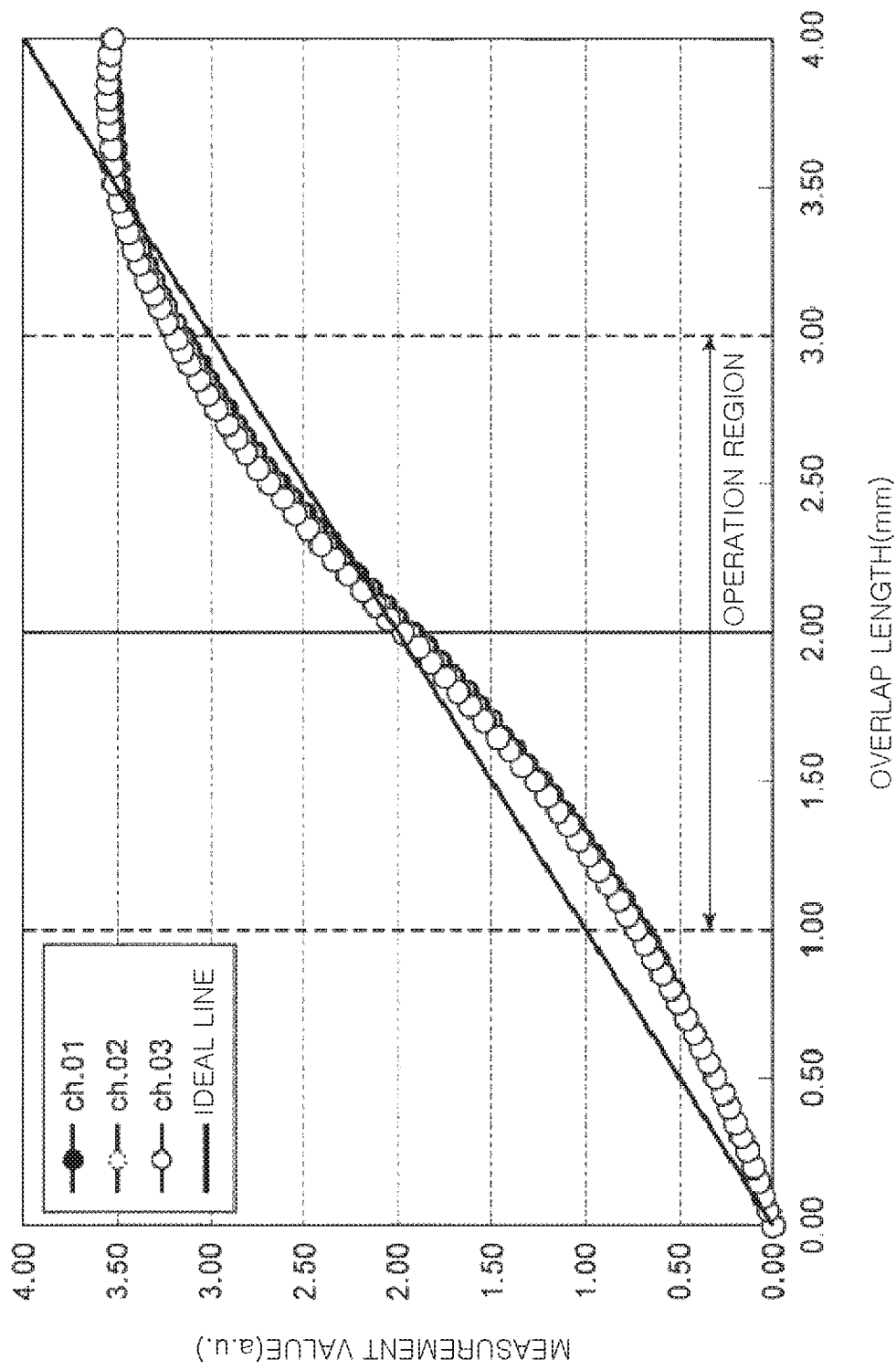
FIG. 14 is a graph showing relation between an overlap length and a measurement value.

FIG. 14 is a graph showing the relation between the overlap length and the measurement value indicating the electrostatic capacitance C. In the graph of FIG. 14, for example, the measurement values measured by the second sensors 105A to 105C are plotted for each overlap length $W_x$. The measurement values of the second sensors 105A to 105C correspond to ch.01 to ch.03, respectively. In FIG. 14, an ideal line showing the relation between the overlap length and the electrostatic capacitance is shown. Even if the overlap length $W_x$ is greater than the diametrical length of the sensor electrode 161, the measurement values (electrostatic capacitances) measured by the three second sensors are increased substantially in the same manner as the ideal line. In the present embodiment, the difference between the inner diameter of the focus ring FR and the outer diameter of the measuring device 100 is 2 mm. Therefore, in the actual operation region, the overlap length $W_x$ is between 1.00 mm and 3.00 mm.

Figure 15:
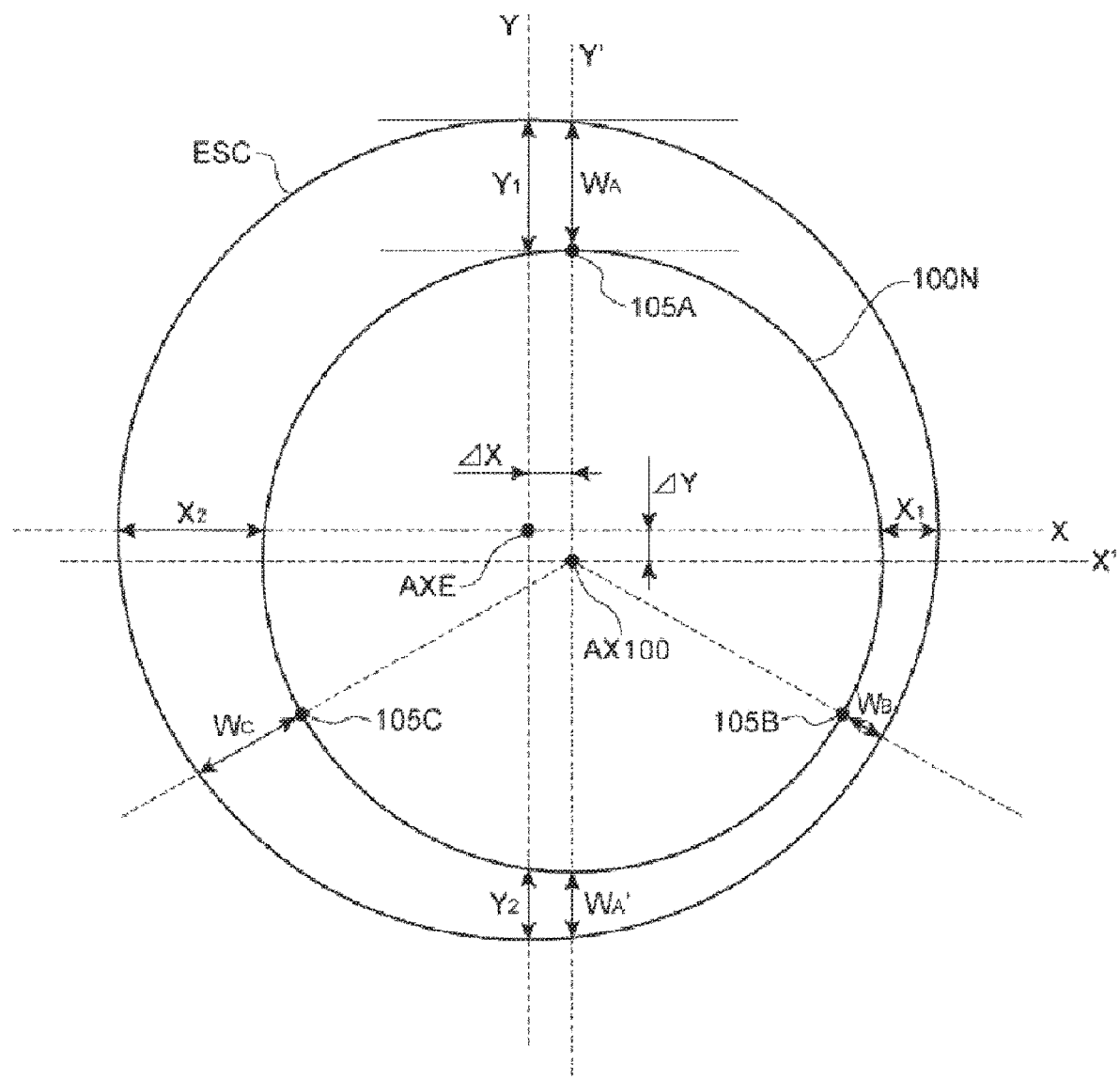
FIG. 15 schematically shows positional relation between the electrostatic chuck and the measuring device.

FIG. 15 schematically shows the positional relation between the electrostatic chuck ESC and the measuring device 100 disposed on the electrostatic chuck ESC. In FIG. 15, the outer edge of the electrostatic chuck ESC and a circle (second circle 100N) along the inner edge of the sensor electrode 161 in the measuring device 100 are shown. Further, in FIG. 15, an orthogonal coordinate system having the X-axis and the-Y axis with the central position of the electrostatic chuck ESC as the origin and an orthogonal coordinate system having the X'-axis and the Y'-axis with the central axis AX100 of the measuring device 100 as the origin are shown. In the illustrated example, the Y' axis is set to pass through the second sensor 105A and the central position.

As shown in the FIG. 15, the amount of deviation between the central position of the electrostatic chuck ESC and the central axis AX100 of the measuring device 100 is represented by ΔX and ΔY. Hereinafter, a method of deriving ΔX and ΔY will be described. In one embodiment, three second sensors 105A to 105C are arranged at a regular interval of 120° in the circumferential direction along the periphery of the base substrate 102 so that the sum B of shortest distances from the outer edge of the electrostatic chuck ESC to the inner edges of the sensor electrodes 161 becomes a constant value. In the illustrated example, an outer diameter $D_e$ of the electrostatic chuck ESC is 297 mm; an outer diameter $D_w$ of the circle along the inner edge of the sensor electrode 161 is 297 mm; and a diametrical length $W_s$ of the sensor electrode 161 is 2.00 mm. On the assumption that the overlap lengths of the sensor electrodes 161 of the second sensors 105A, 105B and 105C are respectively $W_A$, $W_B$ and $W_C$, the following Eq. (17) is satisfied.

$$(W_s-(W_d-D_e)/2) \times 3 = W_A+W_B+W_C=6.0 \text{ mm} \quad \text{Eq. (17)}$$

Since the Eq. (16) is satisfied as described above, on the assumption that the measurement values (electrostatic capacitances) of the second sensors 105A, 105B and 105C are respectively $D_A$, $D_B$ and $D_C$, conditions $W_A=b \cdot D_A$, $W_B=b \cdot D_B$, and $W_C=b \cdot D_C$ are satisfied. In other words, the Eq. (17) is converted into the following Eq. (18).

$$(b \cdot D_A)+(b \cdot D_B)+(b \cdot D_C)=6.00 \text{ mm} \quad \text{Eq. (18)}$$

When the sum B of the overlap lengths of the sensor electrodes 161 is a constant value, the Eq. (18) can be generalized to the following Eq. (19) by using M-number of measurement values Di (i=1, 2, 3, . . . , M).

The Eq. (18) can be generalized to the following Eq. (19). In other words, on the assumption that the measurement values of the M-number of second sensors 105 are Di (i=1, 2, 3, . . . , M), the following Eq. (19) is satisfied. When the sum B of the overlap lengths of the sensor electrodes 161 is a constant value, the sum B can be calculated by $(W_s-(W_d-D_e)/2)/M$.

$$\sum_{i=1}^{M} b \cdot D_i = B \quad \text{Eq. (19)}$$

In the case of deriving ΔX and ΔY, first, the measurement values $D_A$, $D_B$, and $D_C$ of the second sensors 105A to 105C are acquired. By substituting these measurement values $D_A$, $D_B$, and $D_C$ into the above Eq. (18), the constant "b" can be obtained. $W_A$, $W_B$, and $W_C$ are derived from the constant "b" and the measurement values $D_A$, $D_B$, and $D_C$.

$W_A$ can be approximated as the distance $Y_1$ from the outer edge of the electrostatic chuck ESC to the second circle 100N on the Y-axis. In other words, the following Eq. (20) is satisfied.

$$W_A \approx Y_1 \quad \text{Eq. (20)}$$

On the assumption that the distance from the position symmetrical to the second sensor 105A with respect to the origin (the central axis AX100) of the second circle 100N to the outer edge of the electrostatic chuck ESC is $W_A'$, $W_A'$ can be approximated as the distance $Y_2$ from the outer edge of the electrostatic chuck ESC to the second circle 100N on the Y-axis. In other words, the following Eq. (21) is satisfied.

$$W_A' \approx Y_2 \quad \text{Eq. (21)}$$

Here, $Y_1$ and $Y_2$ are distances on the Y-axis. Therefore, the sum of $Y_1$ and $Y_2$ can be approximated as the difference between the outer diameter of the electrostatic chuck ESC and the diameter of the second circle 100N. In other words, the following Eq. (22) is satisfied.

$$Y_1+Y_2 \approx W_A+W_A' \approx 4 \quad \text{Eq. (22)}$$

Since ΔY can be defined as ½ of the difference between $Y_2$ and $Y_1$, ΔY can be obtained from the distance $W_A$ as shown in the following Eq. (23).

$$\Delta Y=(Y_1-Y_2)/2=W_A-2 \quad \text{Eq. (23)}$$

Similarly, on the assumption that the distances from the second circle 100N to the outer edge of the electrostatic chuck ESC on the X-axis are $X_1$ and $X_2$, the following Eq. (24) is satisfied.

$$X_1+X_2 \approx 4 \quad \text{Eq. (24)}$$

The ratio between the overlap length $W_B$ in the second sensor 105B and the overlap length $W_C$ in the second sensor 105C is expressed by the following Eq. (25).

$$X_1:X_2=W_B:W_C \quad \text{Eq. (25)}$$

Here, if the condition $W_C+W_B=Z$ is satisfied, $X_1$ and $X_2$ are expressed by the following Eqs. (26) and (27), respectively.

$$X_1=4W_B/Z=4W_B/(W_C+W_B) \quad \text{Eq. (26)}$$

$$X_2=4W_C/Z=4W_C/(W_C+W_B) \quad \text{Eq. (27)}$$

Therefore, ΔX can be defined as the following Eq. (28) and thus can be calculated from the overlap lengths $W_C$ and $W_B$.

$$\Delta X=(X_1-X_2)/2=2(W_B-W_C)/(W_B+W_C) \quad \text{Eq. (28)}$$

As described above, in one embodiment, the amount of deviation between the central axis AXF of the electrostatic chuck ESC and the central axis AX100 of the measuring device 100 disposed on the electrostatic chuck ESC can be defined as the amount of deviation ΔX in the X-axis direction and the amount of deviation ΔY in the Y-axis direction.

Figure 18:
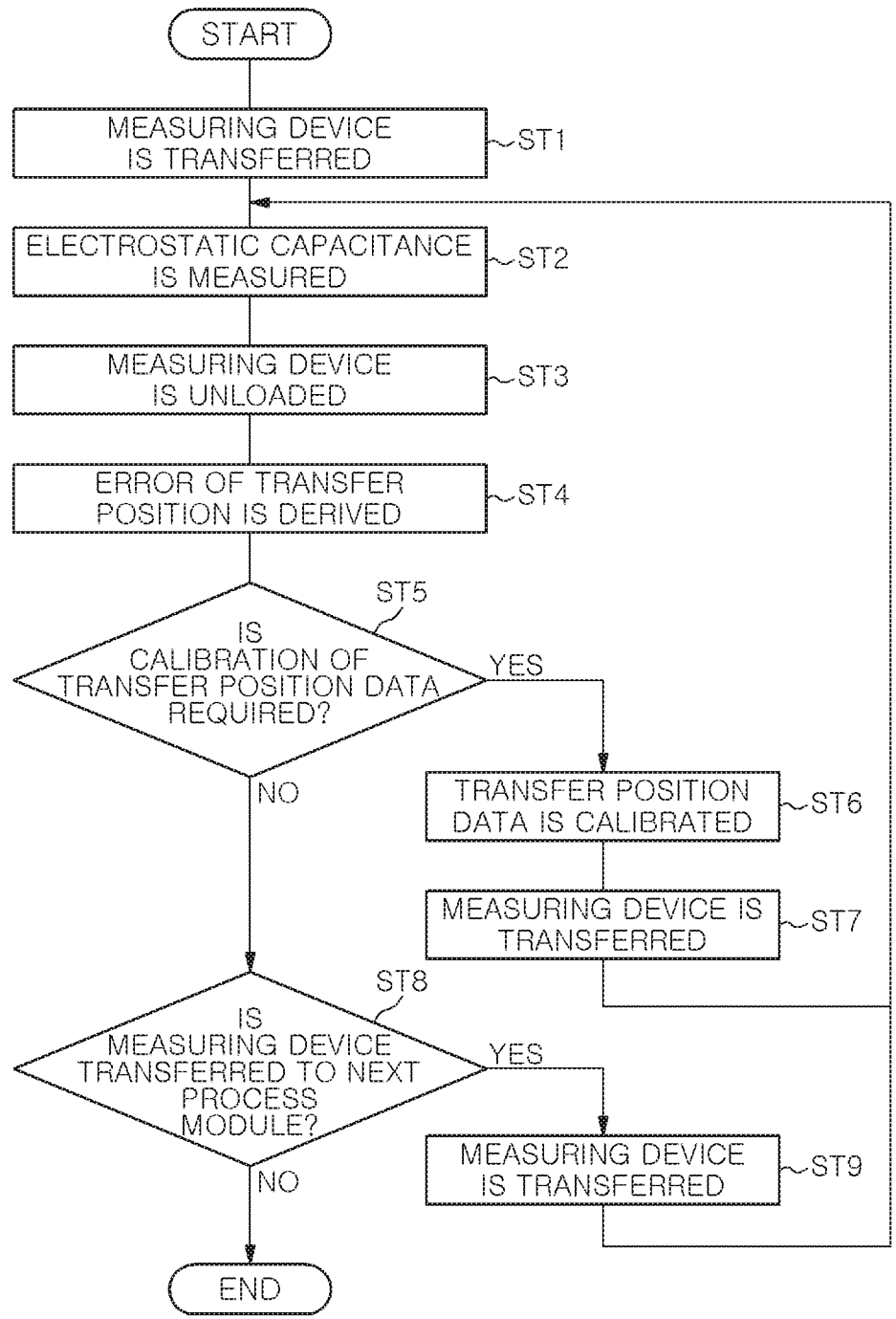
FIG. 18 is a flowchart showing one embodiment of a method of calibrating transfer position data in a processing system.

The following is description on a method of calibrating transfer position data in the processing system 1 by using the measuring device 100. As described above, the transfer unit TU2 in the processing system 1 is controlled by the control unit MC. In one embodiment, the transfer unit TU2 can transfer the target object W and the measuring device 1 onto the mounting region R of the electrostatic chuck ESC based on the transfer position data transmitted from the control unit MC. FIG. 18 is a flowchart showing a method of calibrating a transfer device of a processing system according to one embodiment.

In the method MT shown in FIG. 18, first, a step ST1 is executed. In the step ST1, the measuring device 100 is transferred by the transfer unit TU2 to the position on the mounting region R specified by the transfer position data. Specifically, the transfer unit TU1 transfers the measuring device 100 to one of the load-lock modules LL1 and LL2. Then, based on the transfer position data, the transfer unit TU2 transfers the measuring device 100 from one load-lock module to any one of the process modules PM1 to PM6, and mounts the measuring device 100 on the mounting region R of the electrostatic chuck ESC. The transfer position data is coordinate data that is predetermined such that the position of the central axis AX100 of the measuring device 100 coincides with the central position of the focus ring FR or the mounting region R. An operator can select one of the focus ring FR and the mounting region R as the reference of the central position.

Next, in a step ST2, the measuring device 100 measures the electrostatic capacitance. Specifically, the measuring device 100 acquires a plurality of digital values (measurement values) corresponding to the electrostatic capacitances between the focus ring FR and the sensor electrodes 161 of the first sensors 104A to 104D, and stores the digital values in the storage device 175. Further, the measuring device 100 acquires a plurality of digital values (measurement values) corresponding to the electrostatic capacitances between the mounting region R of the electrostatic chuck ESC and the sensor electrodes 161 of the second sensors 105A to 105D, and stores the digital values in the storage device 175. The digital values can be acquired at predetermined timing under the control of the processor 174.

Next, in a step ST3, the measuring device 100 is unloaded from the process module and returned to any one of the transfer module TF, the load-lock modules LL1 and LL2, the loader module LM and the containers 4a to 4d. Then, in a step ST4, the amount of deviation between the central position of the focus ring FR and the central position of the measuring device 100 and the amount of deviation between the central position of the electrostatic chuck ESC and the central position of the measuring device 100 are derived as errors of the transfer position from the measurement values obtained in the step ST2 by using the above-described method of obtaining the amount of deviation. In the step ST4 of one embodiment, first, a plurality of digital values stored in the storage device 175 is transmitted to the control unit MC. The digital values may be transmitted from the communication device 176 to the control unit MC by a command from the control unit MC, or may be transmitted to the control unit MC at predetermined timing under the control of the processor 174 based on counting of a timer provided on a circuit board 106A. Next, the control unit MC derives the amount of deviation of the transfer position of the measuring device 100 based on the received digital values.

When the amount of deviation of the transfer position of the measuring device 100 is greater than or equal to a predetermined threshold value, it is determined in a next step ST5 that the calibration of the transfer position data is required. In that case, in a step ST6, the transfer position data is calibrated by the control unit MC to eliminate the amount of deviation. Then, in a step ST7, the measuring device 100 is transferred again to the same process module, and the steps ST2 to ST5 are executed again. On the other hand, when the amount of deviation of the transfer position of the measuring device 100 is smaller than the predetermined threshold value, it is determined in the step ST5 that the calibration of the transfer position data is not required. In that case, in a step ST8, it is determined whether or not there is another process module to which the measuring device 100 will be transferred. If there is another process module to which the measuring device 100 is to be transferred, the measuring device 100 is then transferred to the corresponding process module in a step ST9, and the steps ST2 to ST5 are executed. On the other hand, if there is no remaining process module to which the measuring device 100 is to be transferred, the method MT is terminated.

In accordance with the method MT using the measuring device 100, the measuring device 100 provides a plurality of digital values that can be used for calibrating the transfer position data used for the transfer by the transfer unit TU2. By using the digital values, the transfer position data can be calibrated, if necessary. By using the calibrated transfer position data for the transfer of the target object W, the target object W can be transferred to a predetermined transfer position. Further, since the amount of deviation with respect to the focus ring FR and the amount of deviation with respect to the electrostatic chuck can be separately obtained, it is possible to select one of the focus ring FR and the electrostatic chuck ESC as the reference depending on the processing content.

As described above, each of the measurement values acquired by the measuring device is inversely proportional to the shortest distance between the sensor electrode and the focus ring, and thus is defined as $C_i=a/d$. Here, "d" represents the shortest distance between the sensor electrode and the focus ring. Even if the positional relation between the central position of the focus ring and the central position of the measuring device is the same, the constant "a" varies due to differences between the focus rings or consumption of the focus ring. In the method according to the first aspect, since the sensor electrodes are arranged to satisfy the Eq. (1), the constant "a" is obtained based on the Eq. (1) from the measurement values $C_i$. A plurality of distances can be accurately obtained from the constant "a" and each of the measurement values $C_i$. In accordance with the method according to the first aspect, the amount of deviation of the measuring device can be obtained with high accuracy from the distances thus obtained.

Since the electrostatic capacitance is proportional to the electrode area, each of the measurement values acquired by the measuring device is increased as the shortest distance from the second edge to the periphery of the electrostatic chuck is increased. In other words, each of the measurement values acquired by the measuring device is defined as $D_i=(1/b) \times W_x$. Here, "$W_x$" represents the shortest distance from the second edge to the periphery of the electrostatic chuck. Even if the positional relation between the central position of the electrostatic chuck and the central position of the measuring device is the same, the constant "b" varies due to differences between the electrostatic chucks or consumption of the electrostatic chuck. In the method according to the second aspect, the sensor electrodes are arranged to satisfy the Eq. (2) and, thus, the constant "b" is obtained based on the Eq. (2) from the measurement values $D_i$. A plurality of distances is accurately obtained from the constant "b" and the measurement values $D_i$. In accordance with the method according to the second aspect, the amount of deviation of the measuring device can be obtained with high accuracy from the distances thus obtained.

Figure 16:
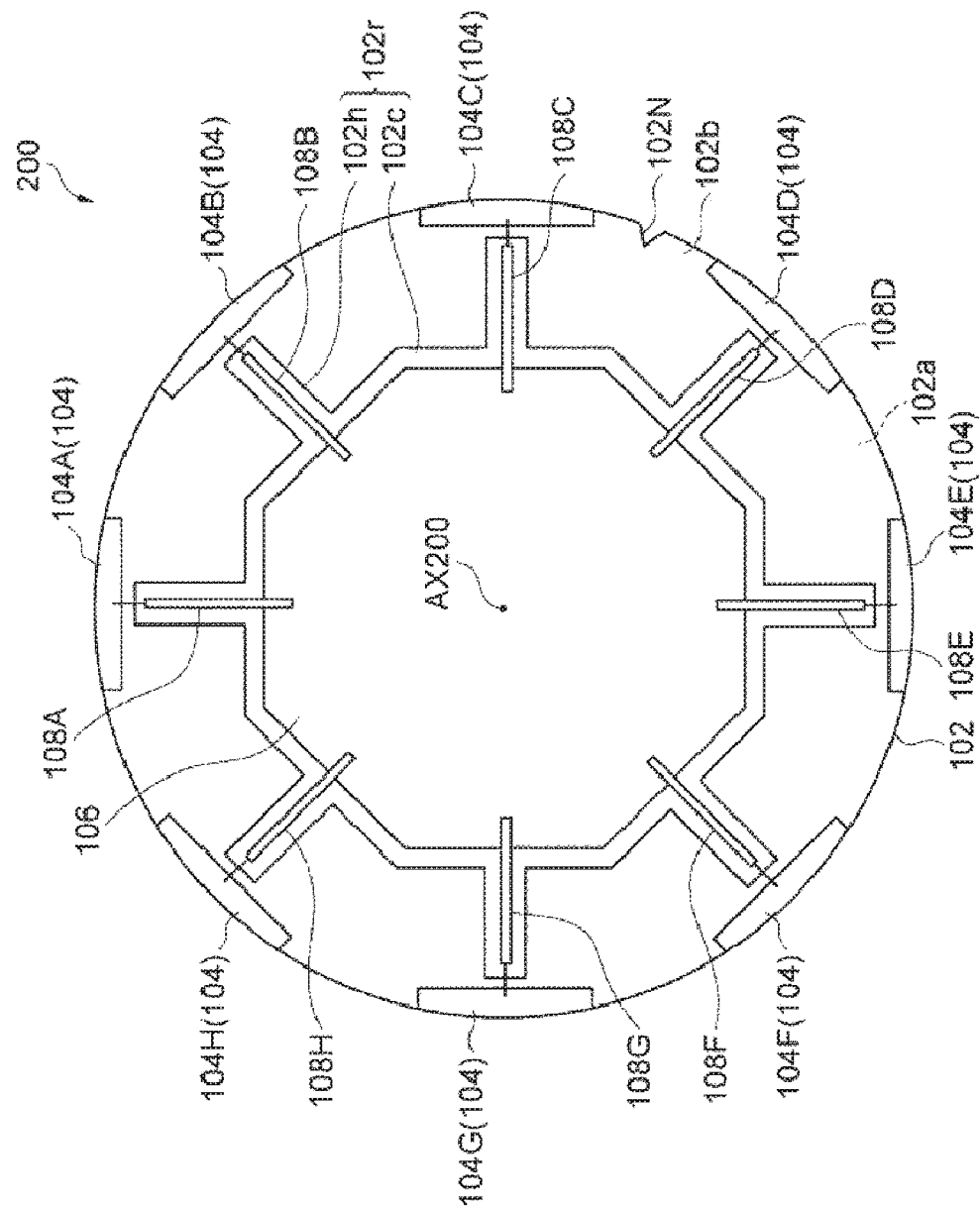
FIG. 16 is a plan view of a measuring device according to another embodiment when viewed from the top.

Next, another embodiment of the measuring device will be described. FIG. 16 is a plan view of a measuring device according to one embodiment. A measuring device 200 shown in FIG. 16 includes a base substrate 102 having an upper portion 102b and a lower portion 102a. A plurality of first sensors 104A to 104H is provided on the upper portion 102b of the base substrate 102. The first sensors 104A to 104H are arranged along the edge of the base substrate 102 at a regular interval in the entire circumference of the edge. In other words, the first sensors 104A and 104E are disposed symmetrically with respect to the central axis AX200. The first sensors 104B and 104F are disposed symmetrically with respect to the central axis AX200. The first sensors 104C and 104G are disposed symmetrically with respect to the central axis AX200. The first sensors 104D and 104H are disposed symmetrically with respect to the central axis AX200.

The upper surface of the upper portion 102b of the base substrate 102 provides a recess 102r. The recess 102r includes a central region 102c and a plurality of radial regions 102h. The central region 102c intersects with the central axis AX 200. The central axis AX 200 passes through the center of the base substrate 102 in the thickness direction. A circuit board 106 is provided in the central area 102c. The radial regions 102h extend from the central region 102c in a radical direction with respect to the central axis AX 200 toward the regions where the first sensors 104A to 104H are disposed. In the radial regions 102h, wiring groups 108A to 108H for electrically connecting the first sensors 104A to 104H to the circuit board 106 are provided. The wiring groups 108A to 108H have the same configuration as that of the wiring group 108 in the measuring device 100.

The following is description on a method of obtaining the amount of deviation between the central position of the focus ring FR and the central position of the measuring device 200 disposed at the inner side of the focus ring FR.

Figure 17:
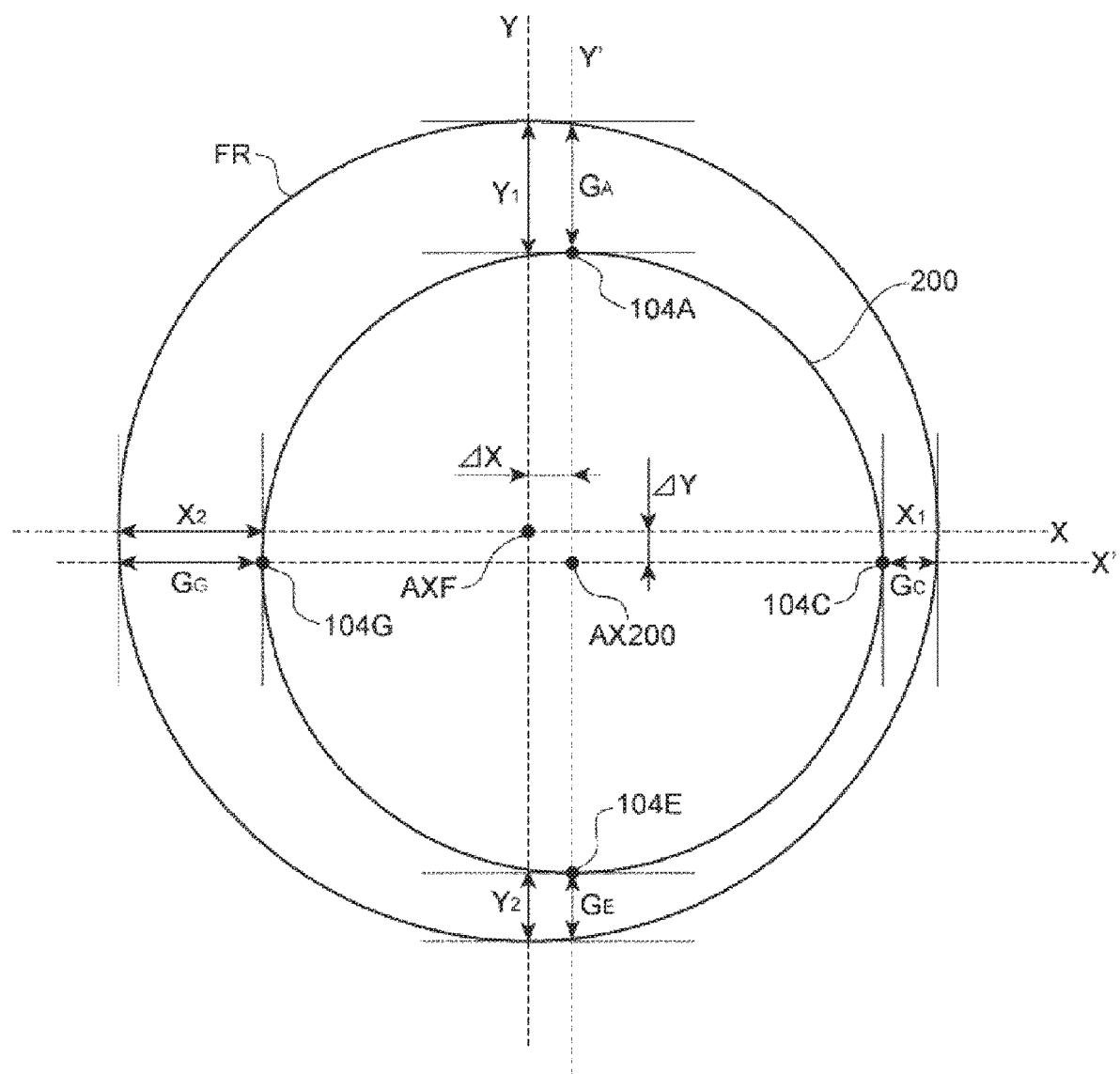
FIG. 17 schematically shows positional relation between a focus ring and the measuring device.

FIG. 17 schematically shows positional relation between the focus ring FR and the measuring device 200 disposed at the inner side of the focus ring FR. In FIG. 17, the inner periphery of the focus ring FR and the edge of the measuring device 200 are shown. Further, in FIG. 17, an orthogonal coordinate system having the X-axis and the Y-axis with the central position of the focus ring FR as the origin and an orthogonal coordinate system having the X'-axis and the Y'-axis with the central position of the measuring device 200 as the origin are shown. In the illustrated example, the Y'-axis is set to pass through the first sensors 104A and 104E and the central position, and the X'-axis is set to pass through the first sensors 104C and 104G and the central position. In the method described below, the amount of deviation ΔY in the Y-axis direction is calculated based on the first sensors 104A and 104E, and the amount of deviation ΔX in the X-axis direction is calculated based on the first sensors 104C and 104G. Therefore, the other first sensors 104B, 104D, 104F and 104H are not shown in FIG. 17.

Hereinafter, a method of deriving ΔX and ΔY will be described. In the present embodiment, the sum A of the shortest distances from the sensor electrodes 143 to the inner peripheral surface of the focus ring FR in the first sensors 104A and 104E becomes a constant value. Further, in the first sensors 104C and 104G, the sum A of the shortest distances from the sensor electrodes 143 to the inner peripheral surface of the focus ring FR becomes a constant value. In the illustrated example, the inner diameter $D_f$ of the focus ring FR is 302 mm and the outer diameter $D_w$ of the measuring device 100 is 300 mm. In that case, on the assumption that the shortest distances from the first sensors 104A, 104C, 104E and 104G to the inner periphery of the focus ring FR are respectively $G_A$, $G_C$, $G_E$ and $G_G$, the following Eqs. (29) and (30) are satisfied.

$$G_A + G_E = 2.00 \text{ mm} \quad \text{Eq. (29)}$$

$$G_C + G_G = 2.00 \text{ mm} \quad \text{Eq. (30)}$$

On the assumption that the measurement values (electrostatic capacitances) of the first sensors 104A, 104C, 104E and 104G are respectively $C_A$, $C_C$, $C_E$ and $C_G$, conditions $G_A = a/C_A$, $G_C = a/C_C$, $G_E = a/C_E$, and $G_G = a/C_G$ are satisfied. In other words, the above Eqs. (29) and (30) are converted into the following Eqs. (31) and (32).

$$(a/C_A) + (a/C_E) = 2.00 \text{ mm} \quad \text{Eq. (31)}$$

$$(a/C_C) + (a/C_G) = 2.00 \text{ mm} \quad \text{Eq. (32)}$$

In the case of deriving ΔX and ΔY, first, the measurement values $C_A$, $C_C$, $C_E$ and $C_G$ are acquired. By substituting the measurement values $C_A$, $C_C$, $C_E$ and $C_G$ into the above Eqs. (31) and (32), the constant "a" can be obtained. The measurement values $G_A$, $G_C$, $G_E$ and $G_G$ are derived from the constant "a" and the respective measurement values $C_A$, $C_C$, $C_E$ and $C_G$.

Since ΔY can be defined as ½ of the difference between $Y_2$ and $Y_1$, ΔY can be obtained from the distances $G_A$ and $G_E$ as shown in the following Eq. (33).

$$\Delta Y = (G_E - G_A)/2 \quad \text{Eq. (33)}$$

Similarly, since ΔX can be defined as ½ of the difference between $X_2$ and $X_1$, ΔX can be obtained from the distances $G_C$ and $G_D$ as in the following Eq. (34).

$$\Delta X = (G_G - G_C)/2 \quad \text{Eq. (34)}$$

As described above, in the present embodiment, the amount of deviation between the central position of the focus ring FR and the central axis AX100 of the measuring device 100 disposed at the inner side of the focus ring FR can be calculated as the amount of deviation ΔX in the X-axis direction and the amount of deviation ΔY in the Y-axis direction.

While the embodiments have been described, various modifications can be made without being limited to the above-described embodiments.

For example, the number of the first sensors and the number of the second sensors mounted on the measuring device are not limited to those in the above embodiments. The number of the first sensors and the number of the second sensors may be three or more. When it is desired to acquire only the amount of deviation in the uniaxial direction, the number of sensors may be two.

Figure 19:
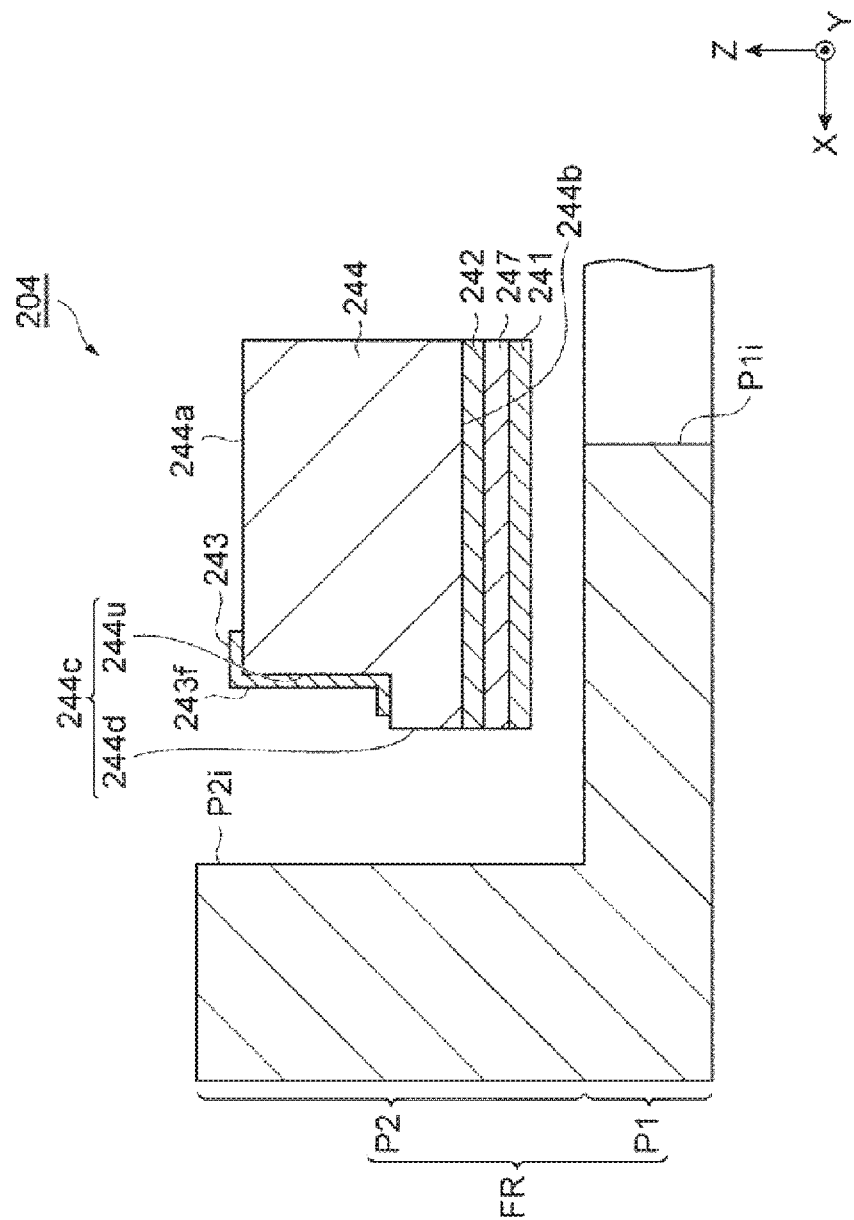
FIG. 19 is a vertical cross sectional view of a first sensor according to another embodiment.

In another embodiment, the first sensors 200 that can be mounted on the measuring device 100 may be another sensor. FIG. 19 is a cross sectional view of a first sensor according to another embodiment. In FIG. 19, a vertical cross sectional view of the first sensor 204 is shown, and the focus ring FR is shown together with the first sensor 204.

The first sensor 204 has a first electrode 241, a second electrode 242, and a third electrode 243. In one embodiment, the first sensor 204 may further include a substrate portion 244 and an insulating region 247.

The substrate portion 244 is made of, e.g., borosilicate glass or quartz. The substrate portion 244 has an upper surface 244a, a lower surface 244b, and a front end surface 244c. The second electrode 242 is provided below the lower surface 244b of the substrate portion 244 and extends in the X direction and the Y direction. Further, the first electrode 241 is provided below the second electrode 242 with the insulating region 247 interposed therebetween, and extends in the X direction and the Y direction.

The front end face 244c of the substrate portion 244 is formed in a stepped shape. A lower portion 244d of the front end surface 244c protrudes toward the focus ring FR compared to an upper portion 244u of the front end surface 244c. The third electrode 243 extends along the upper portion 244u of the front end surface 244c.

In the case of using the first sensor 204 as a sensor of the measuring device 100, the first electrode 241 is connected to the wiring 181; the second electrode 242 is connected to the wiring 182; and the third electrode 243 is connected to the wiring 183.

In the first sensor 204, the third electrode 243 serving as a sensor electrode is shielded from the bottom of the first sensor 204 by the first electrode 241 and the second electrode 242. Therefore, in accordance with the first sensor 204, the electrostatic capacitance can be measured with high directivity in a specific direction, i.e., in a direction (X direction) in which the front surface 243f of the third electrode 243 is directed.

While the present disclosure has been shown and described with respect to the embodiments, it will be understood by those skilled in the art that various changes and modifications may be made without departing from the scope of the present disclosure as defined in the following claims.

What is claimed is:

1. A method of obtaining the amount of deviation of a central position of a measuring device disposed in a region surrounded by a focus ring from a central position of the region, wherein the measuring device includes:
  a disk-shaped base substrate;
  a plurality of sensor electrodes provided on the base substrate;
  a high frequency oscillator configured to apply a high frequency signal to the plurality of sensor electrodes; and
  an operation unit configured to calculate a plurality of measurement values indicating electrostatic capacitances of the plurality of sensor electrodes from a plurality of detection values corresponding to potentials of the plurality of sensor electrodes,
  wherein the plurality of sensor electrodes are provided along a periphery of the base substrate such that a sum A of shortest distances from the plurality of sensor electrodes to an inner peripheral surface of the focus ring becomes a constant value in a state where the measuring device is disposed in the region,
  wherein the sum A satisfies the following Eq. (1), $$\sum_{i=1}^{N} \frac{a}{C_i} = A \qquad \text{Eq. (1)}$$

where N represents the number of the plurality of sensor electrodes, $C_i$ represents the plurality of measurement values and "a" represents a constant,
  the method comprising:
  calculating the plurality of measurement values $C_i$ by using the measuring device disposed in the region;
  calculating the constant "a" in the Eq. (1) by using the plurality of calculated measurement values $C_i$;
  calculating a plurality of distances indicating distances from the plurality of sensor electrodes to the inner peripheral surface of the focus ring by using the calculated constant "a" and the plurality of measurement values $C_i$; and
  calculating the amount of deviation of the central position of the measuring device based on the plurality of calculated distances.

2. A method of calibrating transfer position data in a processing system by using the method described in claim 1, wherein the processing system includes:
  a processing unit having a chamber body and a mounting table provided in a chamber defined by the chamber body; and
  a transfer unit configured to transfer a target object onto the mounting table and into the region surrounded by the focus ring based on the transfer position data,
  the method comprising:
  transferring the measuring device to a position in the region which is specified by the transfer position data by using the transfer device;
  calculating the amount of deviation of the central position of the measuring device by using the method described in claim 1; and
  calibrating the transfer position data by using the amount of deviation of the central position of the measuring device.

3. The method of claim 2, wherein when the amount of deviation of the central position of the measuring device is greater than or equal to a predetermined threshold value, the transfer position data is calibrated.

4. The method of claim 3, further comprising: after the transfer position data is calibrated, transferring the measuring device again to the position on the electrostatic chuck which is specified by the transfer position data by using the transfer device and calculating the amount of deviation of the central position of the measuring device to check whether the amount of deviation of the central position of the measuring device is smaller than the predetermined threshold value.

5. A method of obtaining the amount of deviation of a central position of a measuring device mounted on an electrostatic chuck from a central position of the electrostatic chuck, wherein the measuring device includes:
  a disk-shaped base substrate;
  a plurality of sensor electrodes arranged in a circumferential direction about a central axis of the base substrate along a bottom surface of the base substrate;
  a high frequency oscillator configured to apply a high frequency signal to the plurality of sensor electrodes; and
  an operation unit configured to calculate a plurality of measurement values indicating electrostatic capacitances of the plurality of sensor electrodes from a plurality of detection values corresponding to potentials of the plurality of sensor electrodes,
  wherein the electrostatic chuck includes a ceramic main body having a periphery extending in a circumferential direction about a center of the electrostatic chuck and an electrode provided in the main body, and an edge of the electrode of the electrostatic chuck extends at an inner side of the periphery of the main body in the circumferential direction about the center of the electrostatic chuck,
  radially outer first edges of the plurality of sensor electrodes extend on a first circle having the same radius as a radius of the periphery of the main body of the electrostatic chuck and having the central axis of the base substrate as its center,
  radially inner second edges of the plurality of sensor electrodes extend on a second circle having the same radius as a radius of the edge of the electrode of the electrostatic chuck and having the central axis of the base substrate as its center, and
  the sensor electrodes are provided such that a sum B of shortest distances from the second edges of the plurality of sensor electrodes to the periphery of the electrostatic chuck becomes a constant value in a state where the measuring device is provided on the electrostatic chuck,
  wherein the sum B satisfies the following Eq. (2), $$\sum_{i=1}^{M} b \cdot D_i = B \qquad \text{Eq. (2)}$$

where M represents the number of the plurality of sensor electrodes, $D_i$ represents the plurality of measurement values and "b" represents a constant, the method comprising:

calculating the plurality of measurement values $D_i$ by using the measuring device mounted on the electrostatic chuck;

calculating the constant "b" in the Eq. (2) by using the plurality of calculated measurement values $D_i$;

calculating a plurality of distances indicating distances from the second edges of the plurality of sensor electrodes to the periphery of the electrostatic chuck by using the calculated constant "b" and the plurality of measurement values $D_i$; and calculating the amount of deviation of the central position of the measuring device based on the plurality of calculated distances.

6. A method of calibrating transfer position data in a processing system by using the method described in claim 2, wherein the processing system includes:

a processing unit having a chamber body and an electrostatic chuck provided in a chamber defined by the chamber body;

a transfer unit configured to transfer a target object onto the electrostatic chuck based on the transfer position data, the method comprising:

transferring the measuring device to a position on the electrostatic chuck which is specified by the transfer position data by using the transfer device;

calculating the amount of deviation of the central position of the measuring device by using the method described in claim 5; and calibrating the transfer position data by using the amount of deviation of the central position of the measuring device.

7. The method of claim 6, wherein when the amount of deviation of the central position of the measuring device is greater than or equal to a predetermined threshold value, the transfer position data is calibrated.

8. The method of claim 7, further comprising: after the transfer position data is calibrated, transferring the measuring device again to the position on the electrostatic chuck which is specified by the transfer position data by using the transfer device and calculating the amount of deviation of the central position of the measuring device to check whether the amount of deviation of the central position of the measuring device is smaller than the predetermined threshold value.

* * * * *